United States Patent
Ausserlechner

(10) Patent No.: US 9,425,385 B2
(45) Date of Patent: Aug. 23, 2016

(54) VERTICAL HALL EFFECT DEVICE

(71) Applicant: Infineon Technologies AG, Neubiberg (DE)

(72) Inventor: Udo Ausserlechner, Villach (AT)

(73) Assignee: Infineon Technologies AG, Neubiberg (DE)

( * ) Notice: Subject to any disclaimer, the term of this patent is extended or adjusted under 35 U.S.C. 154(b) by 165 days.

(21) Appl. No.: 14/273,807

(22) Filed: May 9, 2014

(65) Prior Publication Data

US 2015/0323614 A1    Nov. 12, 2015

(51) Int. Cl.
| | | |
|---|---|---|
| G01R 33/07 | (2006.01) |
| H01L 43/06 | (2006.01) |
| G01R 33/00 | (2006.01) |
| H01L 43/04 | (2006.01) |
| H01L 27/22 | (2006.01) |

(52) U.S. Cl.
CPC ......... *H01L 43/065* (2013.01); *G01R 33/0023* (2013.01); *G01R 33/077* (2013.01); *H01L 27/22* (2013.01); *H01L 43/04* (2013.01)

(58) Field of Classification Search
CPC .. G01R 33/07; G01R 33/075; G01R 33/077; H01L 43/04; H01L 43/065
USPC ........................................................ 324/251
See application file for complete search history.

(56) References Cited

U.S. PATENT DOCUMENTS

| | | | |
|---|---|---|---|
| 4,829,352 A | 5/1989 | Popovic et al. |
| 6,127,821 A | 10/2000 | Ramsden et al. |
| 6,184,679 B1 | 2/2001 | Popovic et al. |
| 7,782,050 B2 | 8/2010 | Ausserlechner et al. |
| 7,872,322 B2 | 1/2011 | Schott et al. |
| 8,922,207 B2 * | 12/2014 | Ausserlechner ....... G01R 33/07 324/251 |
| 2007/0290682 A1 | 12/2007 | Oohira et al. |
| 2010/0123458 A1 | 5/2010 | Schott |
| 2010/0133632 A1 | 6/2010 | Schott |
| 2010/0219810 A1 | 9/2010 | Rocznik et al. |

(Continued)

FOREIGN PATENT DOCUMENTS

| | | |
|---|---|---|
| DE | 10150955 C1 | 6/2003 |
| EP | 0143875 A1 | 6/1985 |

(Continued)

OTHER PUBLICATIONS

Notice of Allowance Dated Dec. 18, 2015 U.S. Appl. No. 14/273,771.

(Continued)

*Primary Examiner* — Reena Aurora
(74) *Attorney, Agent, or Firm* — Eschweiler & Associates, LLC

(57) ABSTRACT

A vertical Hall effect device includes at least four Hall effect regions which are partly decoupled from each other, and each of the at least four Hall effect regions has first and second opposite faces. Each of the Hall effect regions has on the first face a first contact and a second contact that are placed symmetrically with respect to a plane of symmetry at the respective Hall effect region, wherein the plane of symmetry is orientated perpendicular to a straight line between the first contact and the second contact of the respective Hall effect region. Each of the Hall effect regions has at least one contact area placed in an area around the respective plane of symmetry, wherein low ohmic connection means include at least one low ohmic connecting path connecting the contact areas of the Hall effect regions.

27 Claims, 23 Drawing Sheets

(56) References Cited

U.S. PATENT DOCUMENTS

| | | |
|---|---|---|
| 2010/0219821 A1 | 9/2010 | Rocznik et al. |
| 2013/0015853 A1 | 1/2013 | Raz et al. |
| 2013/0021026 A1 | 1/2013 | Ausserlechner |
| 2013/0127453 A1 | 5/2013 | Ausserlechner |
| 2013/0214775 A1 | 8/2013 | Ausserlechner et al. |
| 2013/0342194 A1 | 12/2013 | Motz et al. |
| 2014/0210461 A1 | 7/2014 | Ausserlechner |
| 2015/0323613 A1* | 11/2015 | Ausserlechner ..... G01R 33/077 324/251 |

FOREIGN PATENT DOCUMENTS

| | | | |
|---|---|---|---|
| EP | 2071347 | A2 | 6/2009 |
| EP | 2192417 | A2 | 6/2010 |
| EP | 2546670 | A2 | 1/2013 |
| WO | 2004025742 | A1 | 3/2004 |

OTHER PUBLICATIONS

U.S. Appl. No. 13/753,195, filed Jan. 21, 2014.
R.S. Propovic, "Hall Devices for Magnetic Sensor Microsystems", 1997 IEEE International Conference on Solid-State Sensors and Actuators, Chicago, Jun. 16-19, 1997, p. 377-350.
U.S. Appl. No. 14/273,771.
Notice of Allowance dated Aug. 15, 2014 for U.S. Appl. No. 13/298,917.
English translation of Chinese Office Action dated Jul. 11, 2014 for co-pending Chinese application No. 201210467043.1.
Non Final Office Action Dated Jun. 27, 2016 U.S. Appl. No. 14/539,503.

* cited by examiner

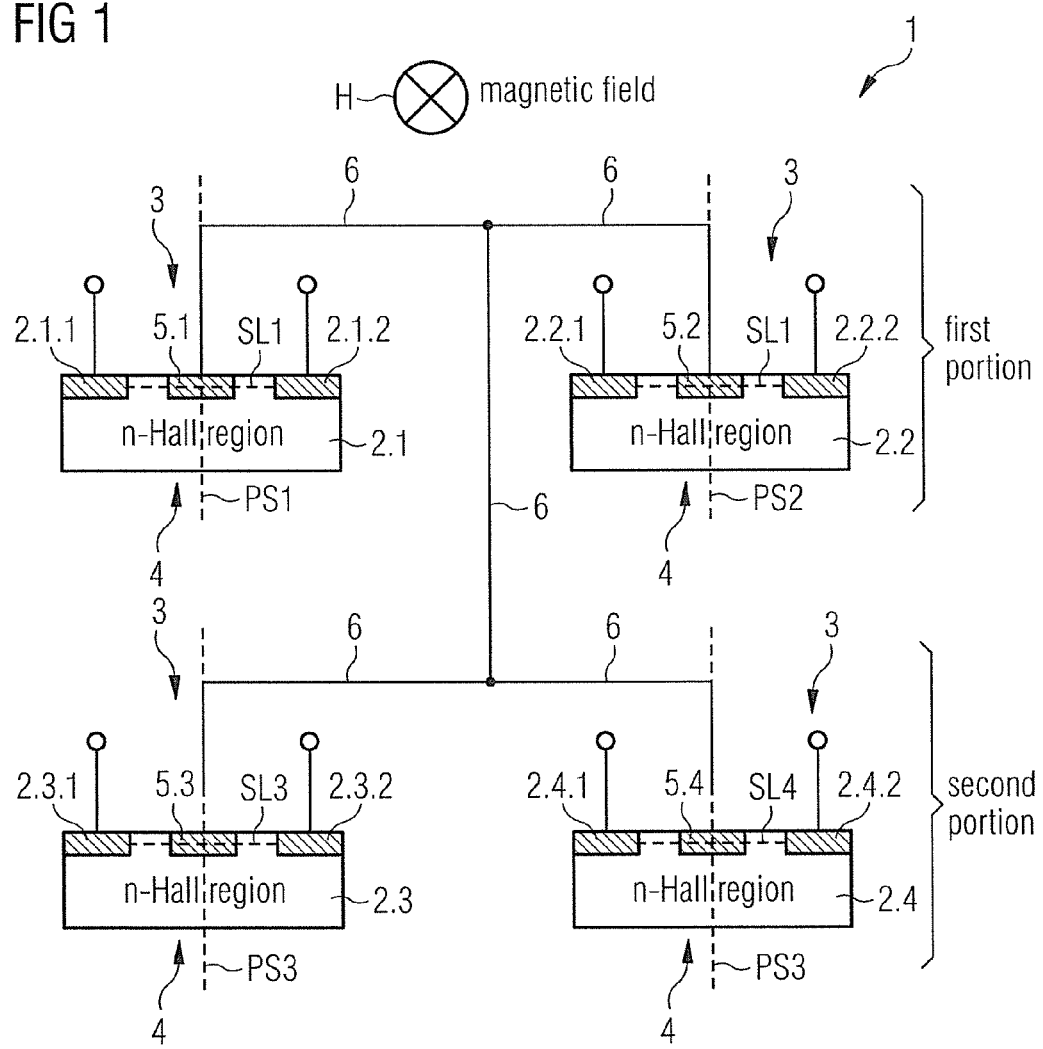

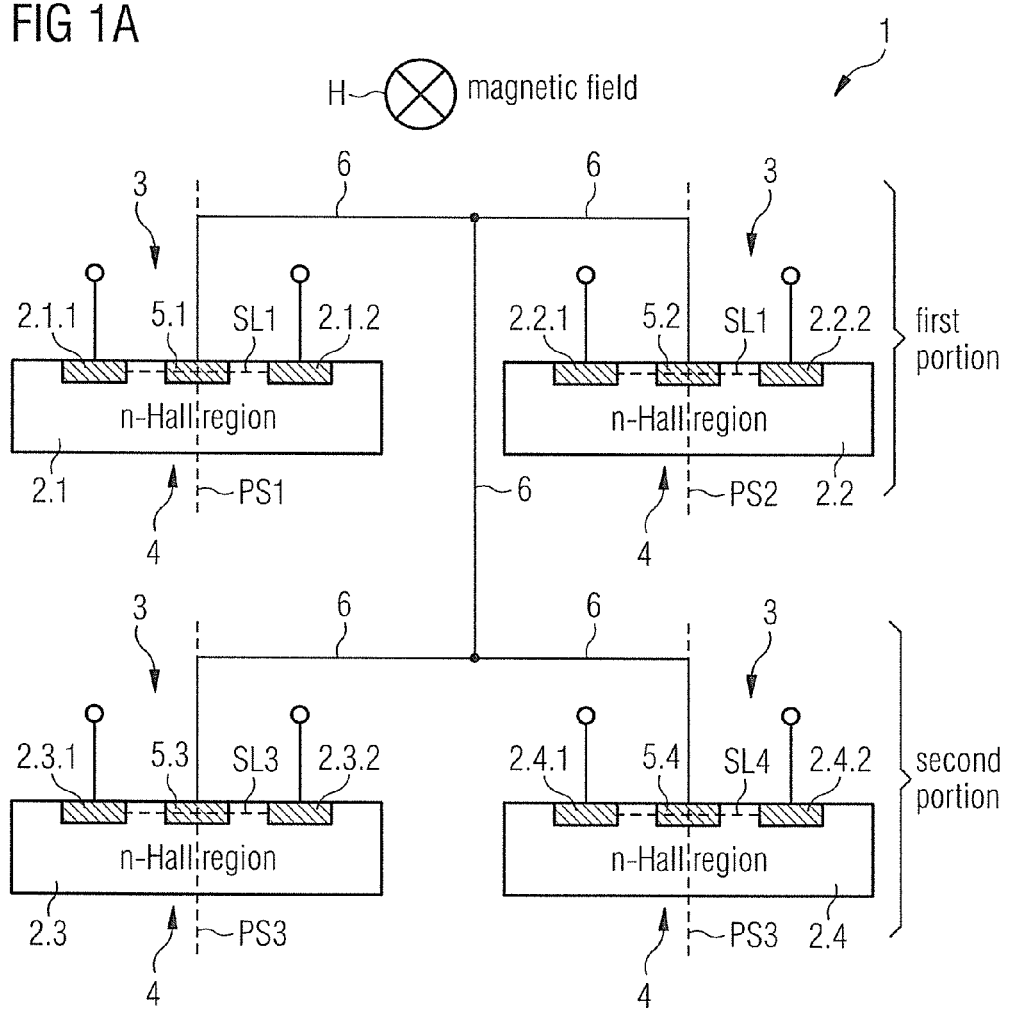

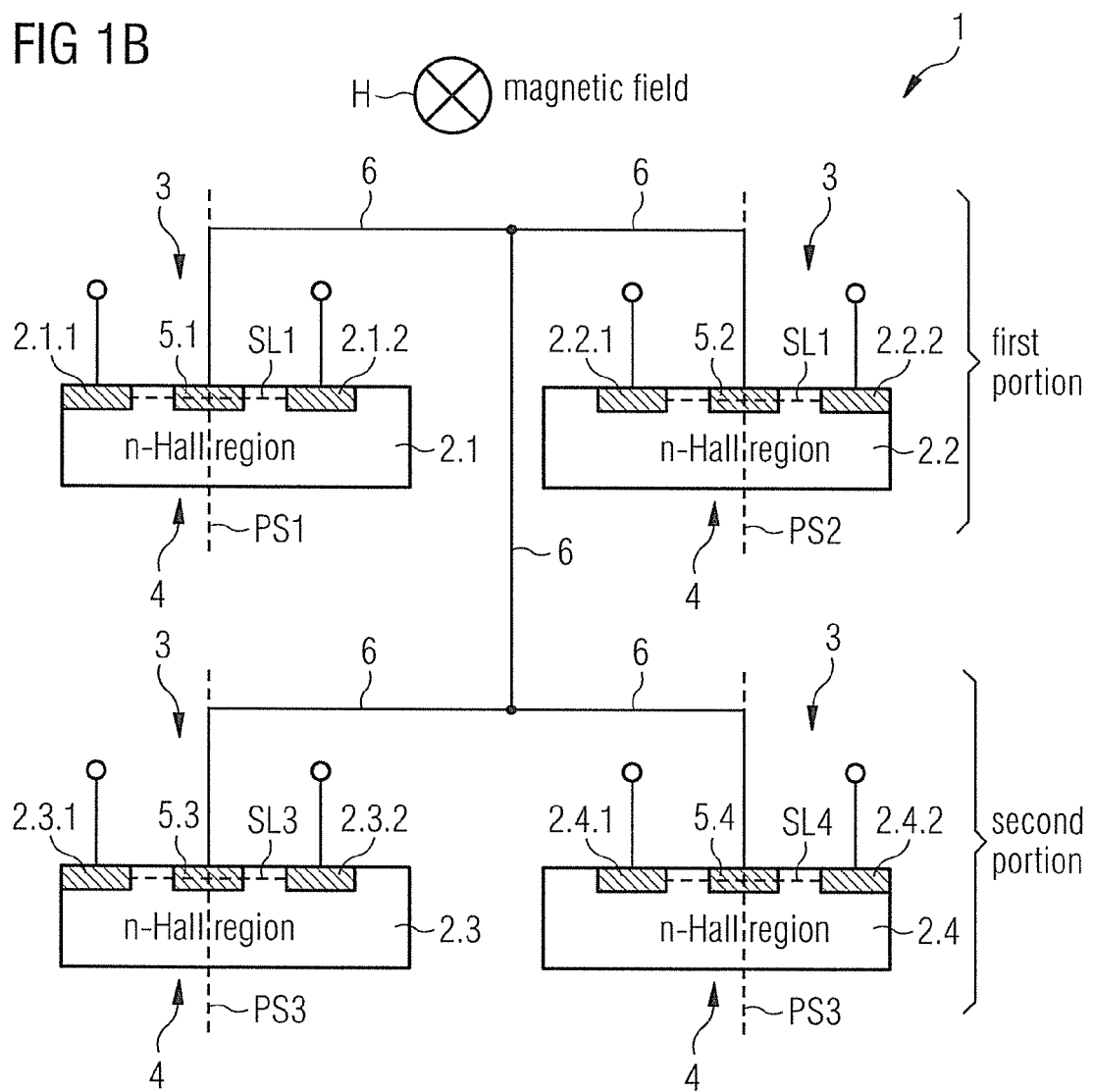

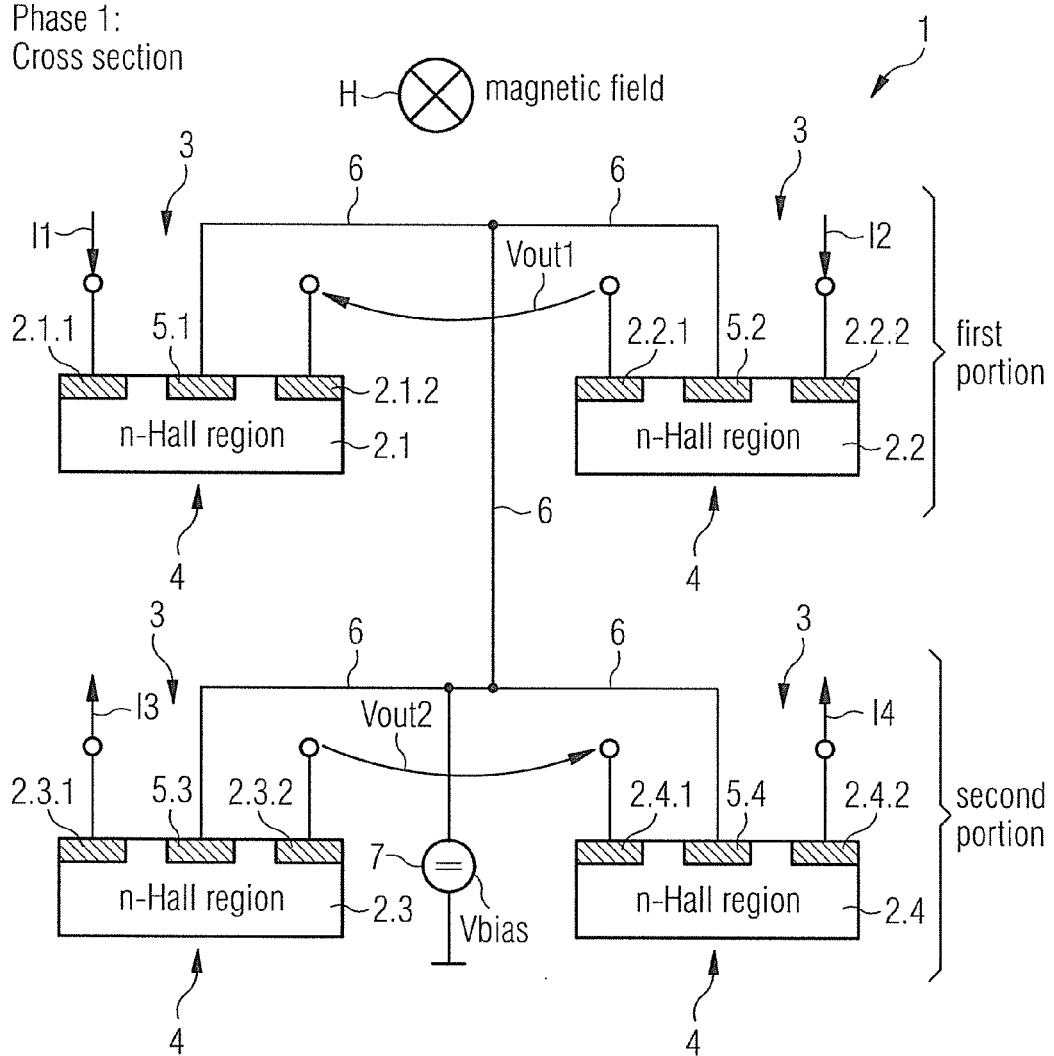

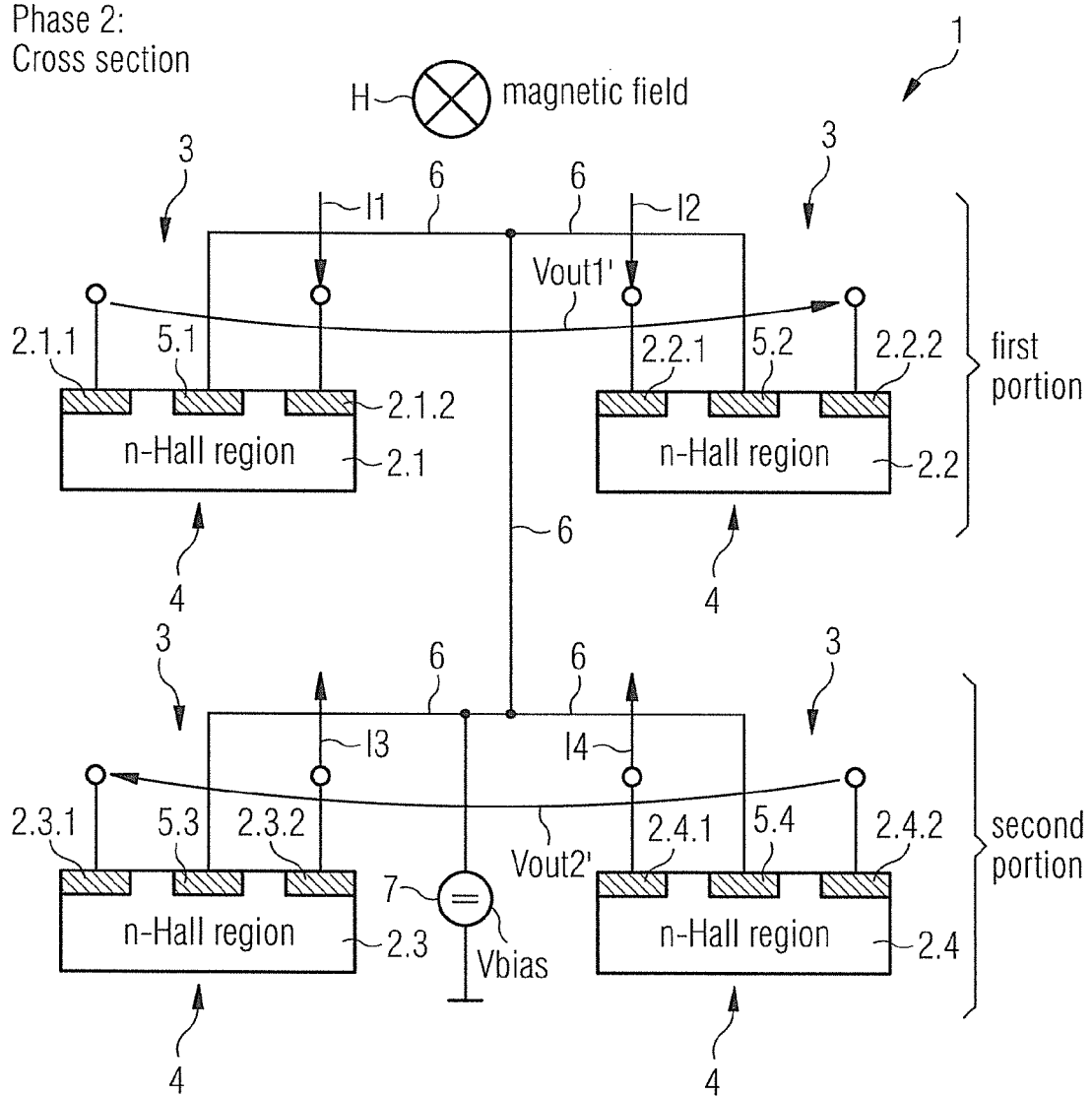

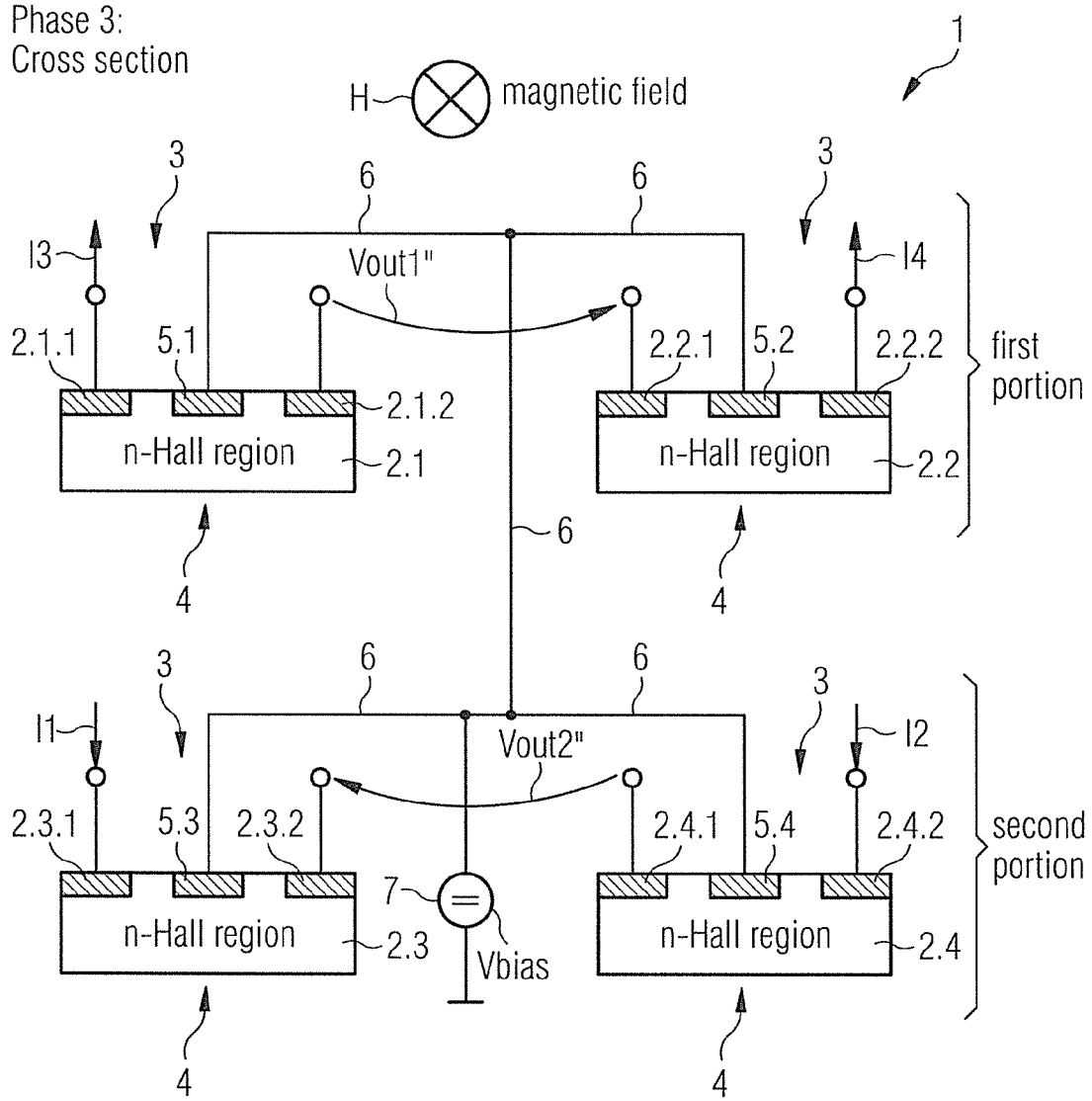

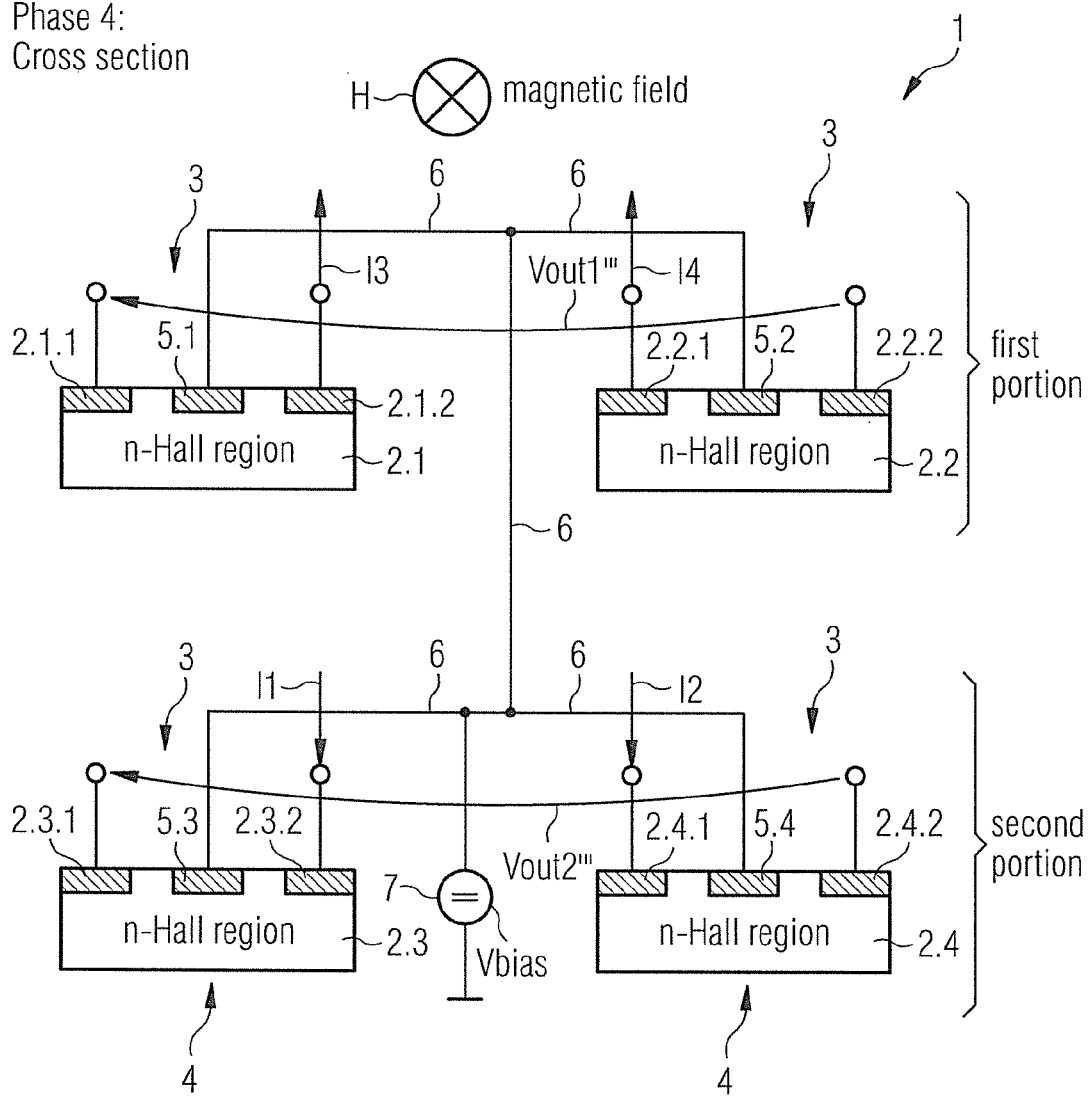

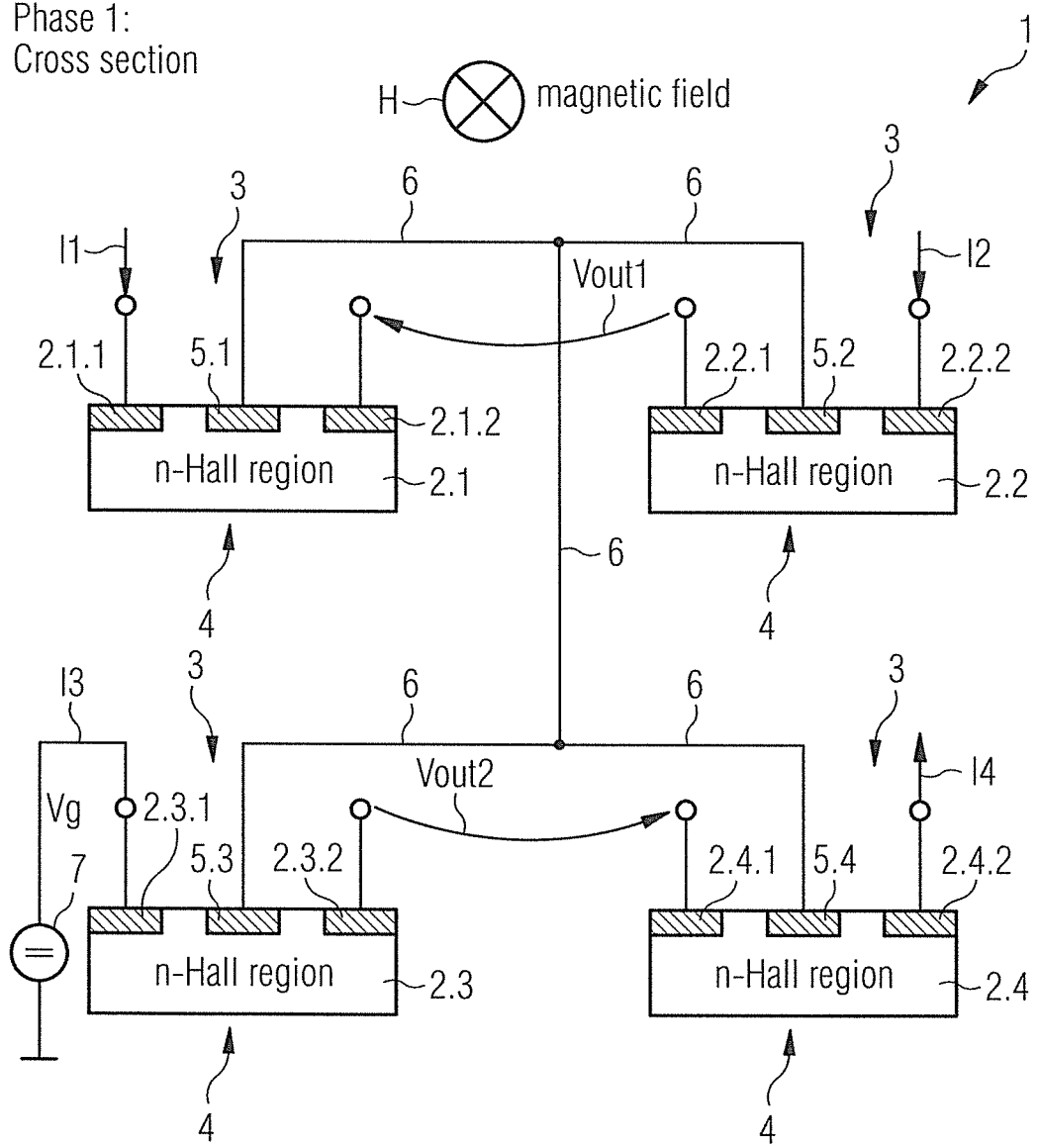

Phase 3:
Cross section

Phase 2:
Cross section

Phase 1:
Cross section

FIG 15
Plan view
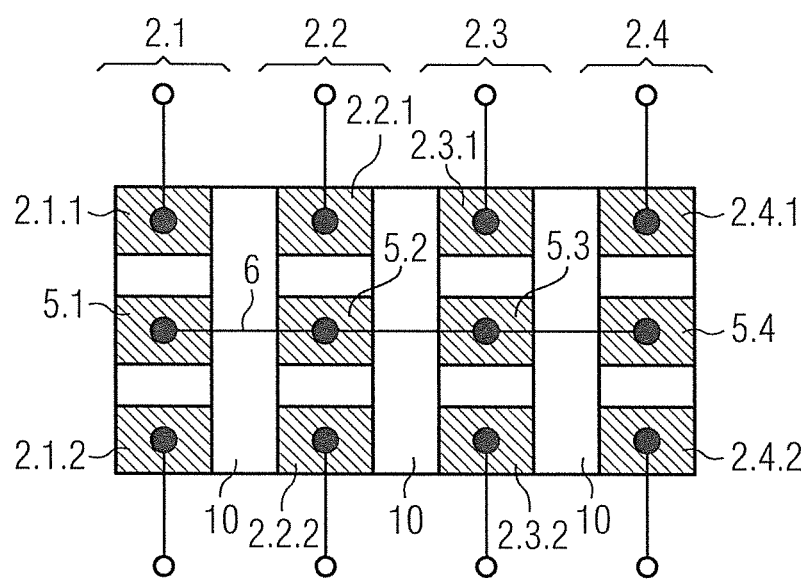
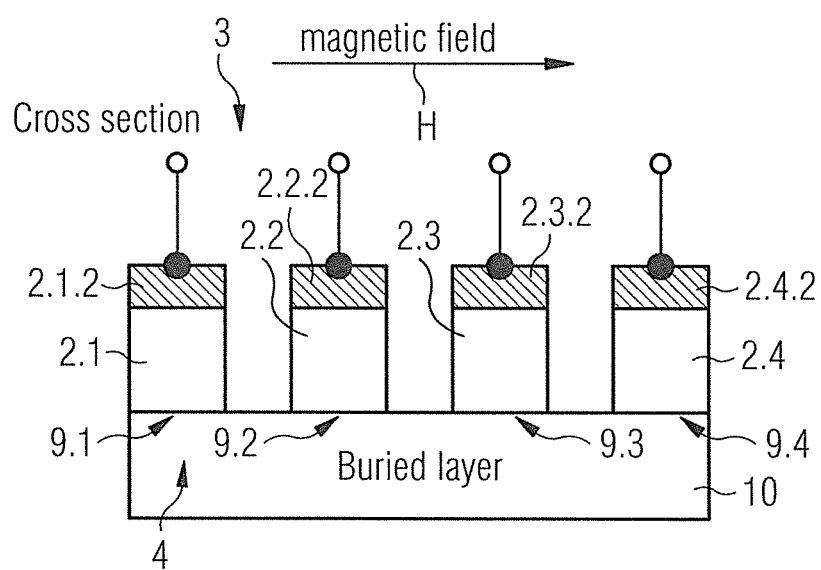

FIG 16
Plan view
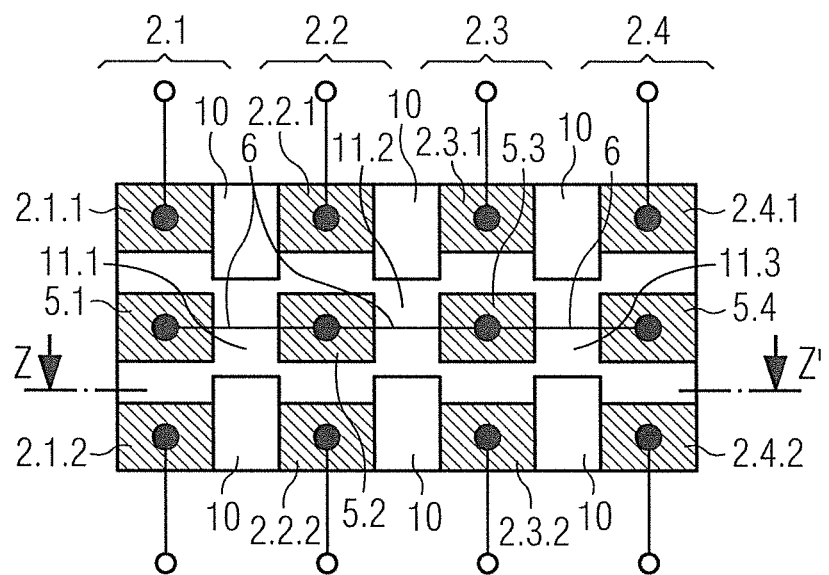
Cross section Z-Z'
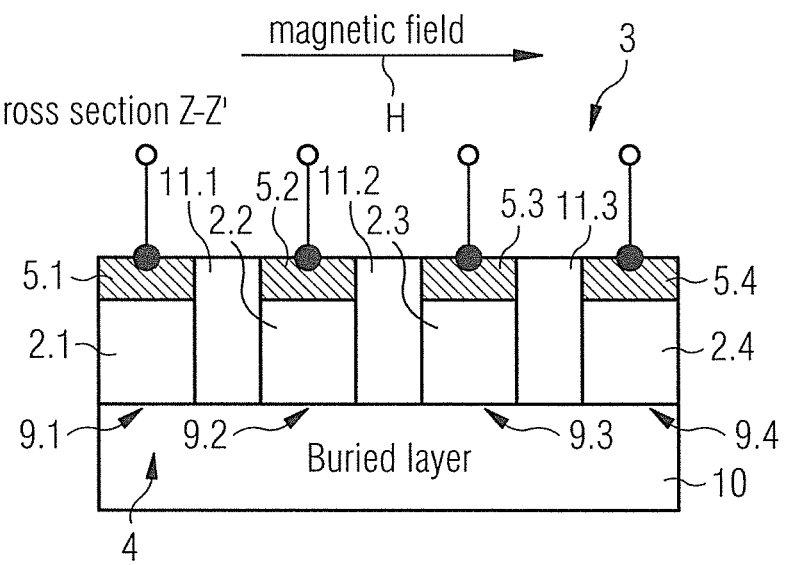

FIG 17
Plan view
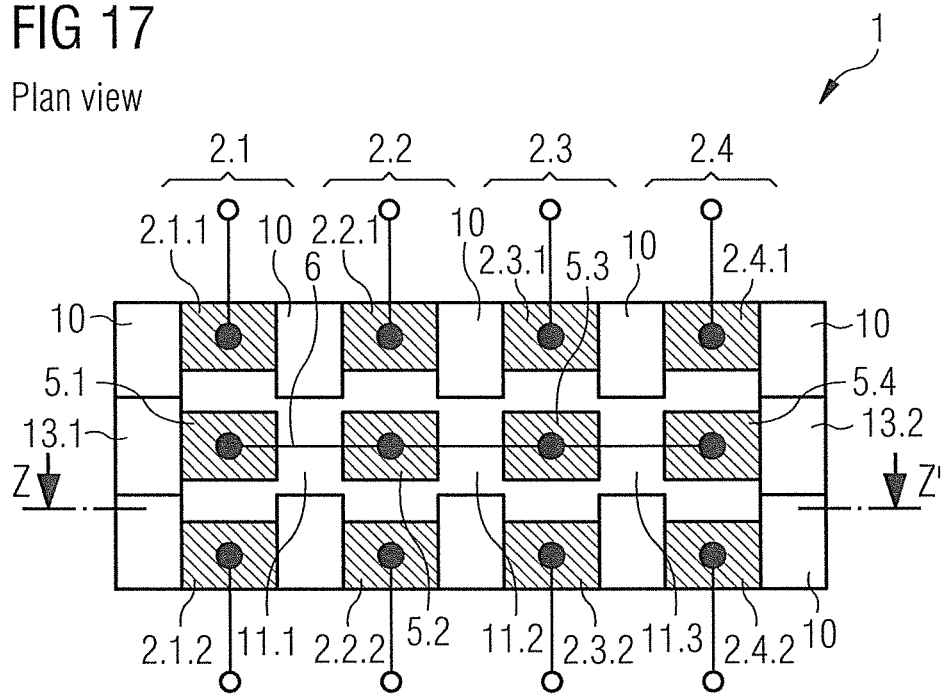
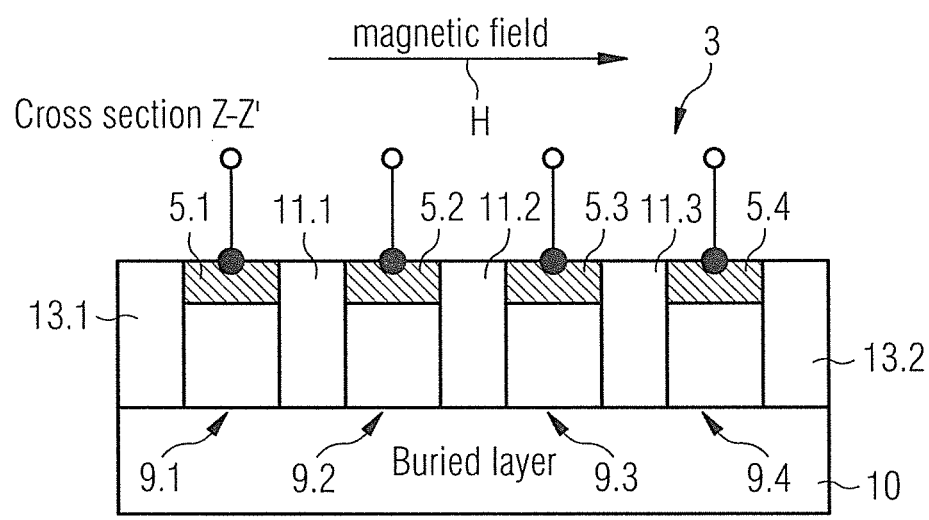

FIG 18
Plan view
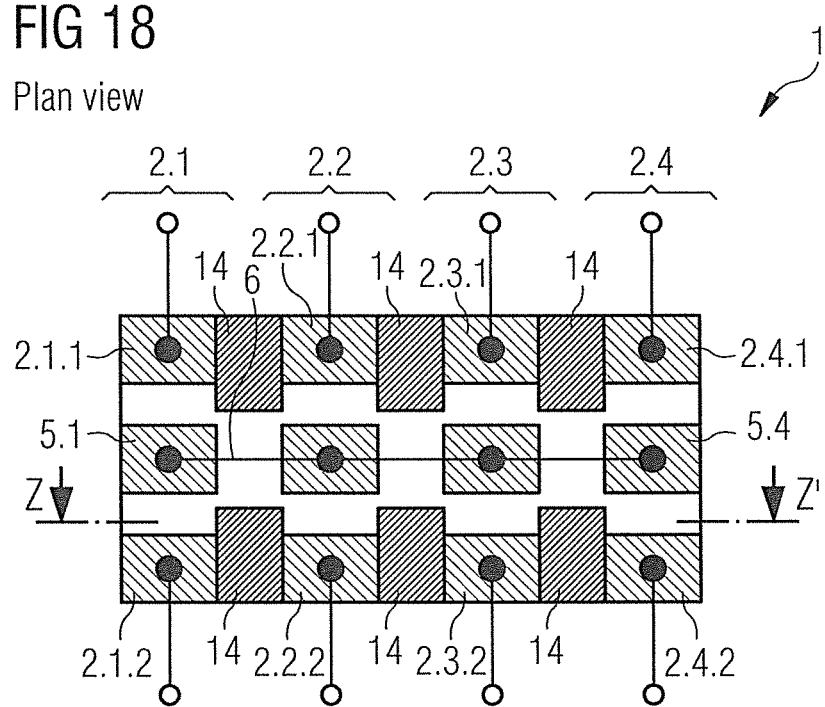
Cross section Z-Z'
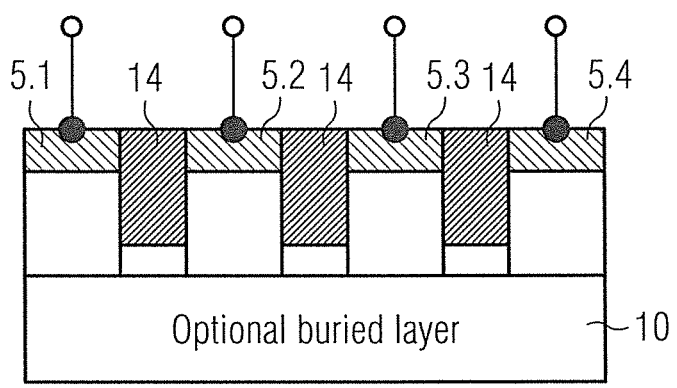

Plan view

Plan view

VERTICAL HALL EFFECT DEVICE

TECHNICAL FIELD

Embodiments relate to a vertical Hall effect device and to a system, comprising at least two vertical Hall effect device.

BACKGROUND

Hall effect devices are sensors that respond to a magnetic field. They typically suffer from offset error: the offset error is a non-vanishing output signal at zero applied magnetic field. Hall effect devices consist of one or several Hall effect regions with supply terminals and signal terminals. The Hall effect takes place in the Hall effect regions where the Lorentz force of the magnetic field on the moving charge carriers gives rise to a Hall electric field. The moving charge carriers are supplied by an electric power source which is connected to the supply terminals. At the signal terminals the output signal of the Hall effect device can be tapped. All terminals are ohmic contacts which makes the Hall effect device a purely resistive device. Vertical Hall effect devices (VHall) mainly respond to a magnetic field parallel to the surface of a substrate used for the fabrication of the respective vertical Hall effect device.

A number of different designs of vertical Hall effect devices are known, yet many of them are not apt for the so-called spinning current or spinning voltage method (or achieve only poor offset-cancelling performance) and suffer from low magnetic sensitivity and large electric fields. Typically, several contacts are placed on the surface of the substrate in such a way that current can flow in semicircles between two supply contacts while a sense contact is placed between these supply contacts and taps the Hall voltage that is generated by the current diving underneath the sense contact.

SUMMARY

A vertical Hall effect device is provided. The vertical Hall effect device comprises:
at least four Hall effect regions comprising a first Hall effect region, a second Hall effect region, a third Hall effect region and a fourth Hall effect region, which are at least partly decoupled from each other;
wherein each of the at least four Hall effect regions has a first face and a second face opposite of the first face;
wherein each of the at least four Hall effect regions has on the first face a first contact as well as a second contact, wherein the first contact and the second contact are placed symmetrically with respect to a plane of symmetry at the respective Hall effect region, wherein the plane of symmetry is orientated perpendicular to a straight line between the first contact and the second contact of the respective Hall effect region;
wherein each of the at least four Hall effect regions has at least one contact area, which is placed at least in an area around the respective plane of symmetry, wherein low ohmic connection means comprise at least one low ohmic connecting path connecting the contact areas of the at least four Hall effect regions.

Furthermore, a system comprising at least two vertical Hall effect devices according to the invention is provided, wherein the vertical Hall effect devices are connected in series so that at least 75% of a supply current flowing through a first vertical Hall effect device is flowing through a second vertical Hall effect device.

BRIEF DESCRIPTION OF THE DRAWINGS

Embodiments of the present invention are described herein making reference to the appended drawings.

FIG. 1 shows a schematic, cross-sectional view of a first embodiment of a vertical Hall effect device comprising four Hall effect regions;

FIG. 1a shows a slightly modified schematic, cross-sectional view of the first embodiment of a vertical Hall effect device comprising four Hall effect regions;

FIG. 1b shows a further slightly modified schematic, cross-sectional view of the first embodiment of a vertical Hall effect device comprising four Hall effect regions;

FIG. 2 shows a schematic, cross-sectional view of the first embodiment of the vertical Hall effect device used in a first mode of operation;

FIG. 3 shows a schematic, cross-sectional view of the first embodiment of the vertical Hall effect device used in a second mode of operation;

FIG. 4 shows a schematic, cross-sectional view of the first embodiment of the vertical Hall effect device used in a third mode of operation;

FIG. 5 shows a schematic, cross-sectional view of the first embodiment of the vertical Hall effect device used in a third mode of operation;

FIG. 6 shows a schematic, cross-sectional view of a second embodiment of the vertical Hall effect device used in a first mode of operation;

FIG. 15 shows a schematic, plan view and a schematic, cross-sectional view of the fifth embodiment of the vertical Hall effect device;

FIG. 16 shows a schematic, plan view and a schematic, cross-sectional view of a sixth embodiment of the vertical Hall effect device;

FIG. 17 shows a schematic, plan view and a schematic, cross-sectional view of a seventh embodiment of the vertical Hall effect device;

FIG. 18 shows a schematic, plan view and a schematic, cross-sectional view of an eighth embodiment of the vertical Hall effect device;

Figure 7:
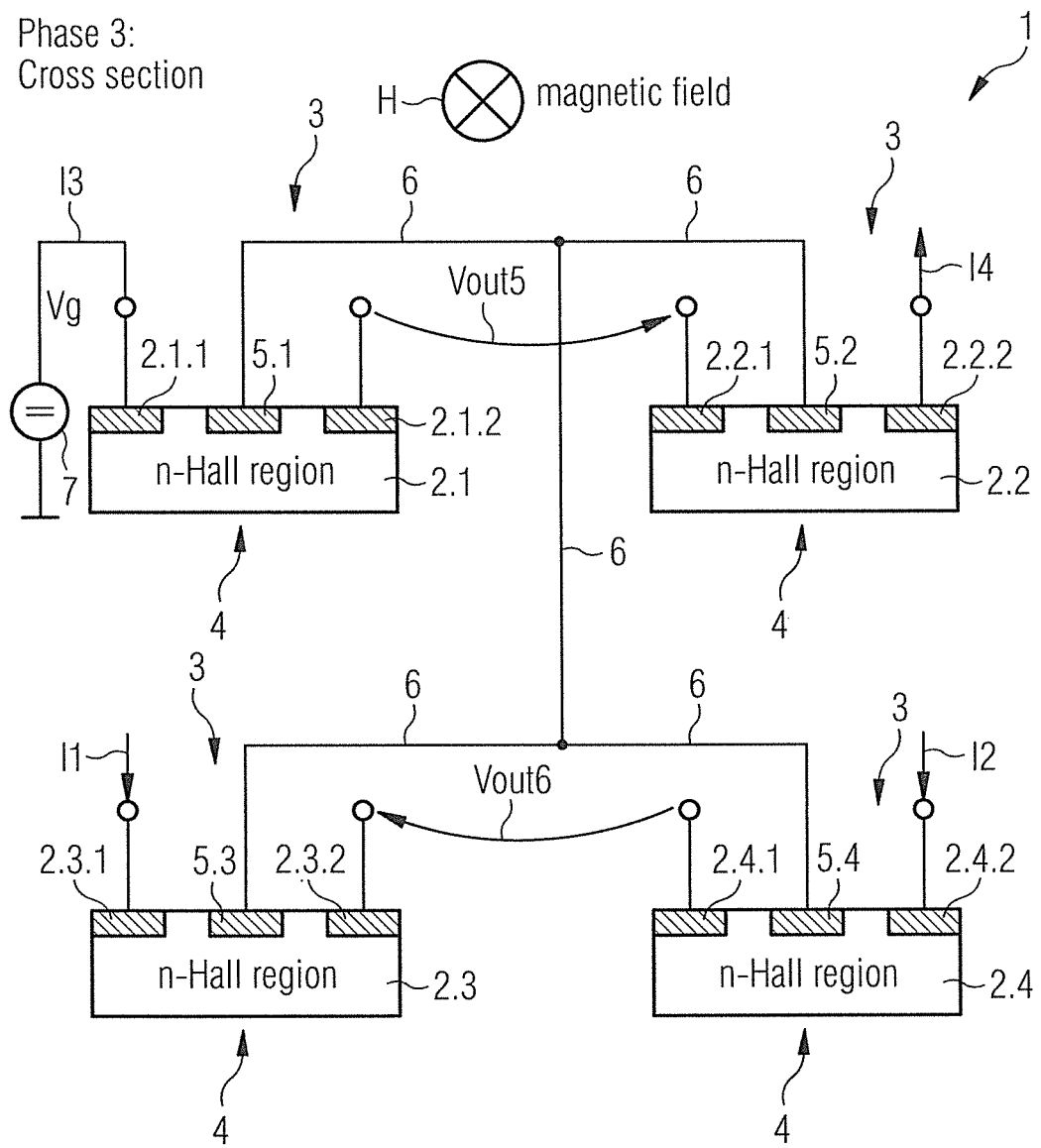
FIG. 7 shows a schematic, cross-sectional view of the second embodiment of the vertical Hall effect device used in a third mode of operation.

Equal or equivalent elements or elements with equal or equivalent functionality are denoted in the following description by equal or equivalent reference numerals.

DETAILED DESCRIPTION

In the following description, a plurality of details is set forth to provide a more thorough explanation of embodiments of the present invention. However, it will be apparent to those skilled in the art that embodiments of the present invention may be practiced without these specific details. In other instances, well-known structures and devices are shown in block diagram form rather than in detail in order to avoid obscuring embodiments of the present invention. In addition, features of the different embodiments described hereinafter may be combined with each other, unless specifically noted otherwise.

FIG. 1 shows a schematic, cross-sectional view of a first embodiment of a vertical Hall effect device 1. According to the first embodiment, the vertical Hall effect device 1 comprises:

at least four Hall effect regions 2.1, 2.2, 2.3, 2.4 comprising a first Hall effect region 2.1, a second Hall effect region 2.2, a third Hall effect region 2.3 and a fourth Hall effect region 2.4, which are at least partly decoupled from each other;

wherein each of the at least four Hall effect regions has a first face 3 and a second face 4 opposite of the first face 3;

wherein each of the at least four Hall effect regions 2.1, 2.2, 2.3, 2.4 has on the first face 4 a first contact 2.1.1, 2.2.1, 2.3.1, 2.4.1 as well as a second contact 2.1.2, 2.2.2, 2.3.2, 2.4.2, wherein the first contact 2.1.1, 2.2.1, 2.3.1, 2.4.1 and the second contact 2.1.2, 2.2.2, 2.3.2, 2.4.2 are placed symmetrically with respect to a plane of symmetry PS1, PS2, PS3, PS4 at the respective Hall effect region 2.1, 2.2, 2.3, 2.4, wherein the plane of symmetry PS1, PS2, PS3, PS4 is orientated perpendicular to a straight line SL between the first contact 2.1.1, 2.2.1, 2.3.1, 2.4.1 and the second contact 2.1.2, 2.2.2, 2.3.2, 2.4.2 of the respective Hall effect region 2.1, 2.2, 2.3, 2.4;

wherein each of the at least four Hall effect regions 2.1, 2.2, 2.3, 2.4 has at least one contact area 5.1, 5.2, 5.3, 5.4, which is placed at least in an area around the respective plane of symmetry PS1, PS2, PS3, PS4, wherein low ohmic connection means comprise at least one low ohmic connecting path 6 connecting the contact areas 5.1, 5.2, 5.3, 5.4 of the at least four Hall effect regions 2.1, 2.2, 2.3, 2.4.

Note that in FIG. 1 each Hall effect region is shown in cross-sectional view, however the relative position of the four Hall effect regions with respect to each other does not correspond to the same cross-sectional view. In particular FIG. 1 should not be interpreted in a way to denote that Hall effect region 2.1 is placed above Hall effect region 2.3 in cross-sectional view. It should also not mean that Hall effect region 2.1 is placed next to Hall effect region 2.2. Also the low ohmic connecting path 6 denotes merely the connectivity, not the geometry or layout of the path.

The term "plane of symmetry PS1, PS2, PS3, PS4" refers to a plane to which the respective first contact 2.1.1, 2.2.1, 2.3.1, 2.4.1 and second contact 2.1.2, 2.2.2, 2.3.2, 2.4.2 are positioned symmetrically. Preferably the respective Hall effect region 2.1, 2.2, 2.3, 2.4 is symmetric to the respective plane of symmetry PS1, PS2, PS3, PS4 as well. However, there are embodiments in which the respective Hall effect region 2.1, 2.2, 2.3, 2.4 is not symmetric to the respective plane of symmetry PS1, PS2, PS3, PS4.

The vertical Hall effect device 1 comprises a first portion comprising the Hall effect regions 2.1 and 2.2 and a second portion comprising the Hall effect regions 2.3 and 2.4. The combination of the first contacts 2.1.1, 2.2.1, 2.3.1, 2.4.1, the second contacts 2.1.2, 2.2.2, 2.3.2, 2.4.2, the symmetric contact areas 5.1, 5.2, 5.3, 5.4 and the low ohmic connecting path 6 allows to electrically stack the first portion and the second portion in such a way, that essentially the same current flows over both portions while the total voltage per portion is equal to the overall voltage divided by the number of portions in the stack. Smaller voltage per portion means smaller nonlinear effects in the device and this improves the residual offset of a spinning scheme.

In FIG. 1 the Hall effect regions 2.1, 2.2, 2.3, 2.4 are shown in a standalone manner for the sake of clarity. However, the Hall effect regions 2.1, 2.2, 2.3, 2.4 may be embedded in one or more substrates which may serve as an insulation.

The invention provides an electrically stacked vertical Hall effect device 1 without the need for a current splitter between the portions. Therefore, no extra voltage drop over the current splitter occurs between the portions so that the vertical Hall device 1 is highly efficient.

According to a preferred embodiment of the invention each of the at least four Hall effect regions 2.1, 2.2, 2.3, 2.4 has one of said contact areas 5.1, 5.2, 5.3, 5.4 arranged on the first face 3, wherein the low ohmic connecting path 6 contacting the areas 5.1, 5.2, 5.3, 5.4 is arranged on the first face 3. These features facilitate the production of the vertical Hall effect device 1.

According to a preferred embodiment of the invention the low ohmic connecting path 6 arranged on the first face 3 comprises a low ohmic connection wire structure 6. The low ohmic wire structure 6 may be made by any available technology, such as by BiCMOS/CMOS-processes. The low ohmic wire structure 6 may have an elongated form or a laminar or sheet-like form or a squat shape, i.e. it may be essentially one-dimensional or two-dimensional or even three-dimensional. Further, the low ohmic wire structure 6 may be made of metal, such as aluminum or copper, of electrical conductors, such as silicium, or of mixtures thereof. The low ohmic connecting path 6 may comprise switches, in particular MOS-switches.

According to a preferred embodiment of the invention the first Hall effect region 2.1 and the second Hall effect region 2.2 are arranged in such a way that their planes of symmetry PS1, PS2 are parallel or identical, and wherein the third Hall effect region 2.3 and the fourth Hall effect region 2.4 are arranged in such a way that their planes of symmetry PS3, PS4 are parallel or identical. By these features offset errors may be reduced.

According to a preferred embodiment of the invention the first contacts 2.1.1, 2.2.1 of the first Hall effect region 2.1 and the second Hall effect region 2.2 are facing away from the respective plane of symmetry PS1, PS2 in a same direction, wherein the second contacts 2.1.2, 2.2.2 of the first Hall effect region 2.1 and the second Hall effect region 2.2 are facing away from the respective plane of symmetry PS1, PS2 in an opposite direction, wherein the first contacts 2.3.1, 2.4.1 of the third Hall effect region 2.3 and the fourth Hall effect region 2.4 are facing away from the respective plane of symmetry PS3, PS4 in a same direction, wherein the second contacts 2.3.2, 2.4.2 of the third Hall effect region 2.3 and the fourth Hall effect region 2.4 are facing away from the respective plane of symmetry PS3, PS4 in an opposite direction.

According to a preferred embodiment of the invention the first Hall effect region 2.1, the second Hall effect region 2.2, the third Hall effect region 2.3 and the fourth Hall effect region 2.4 are arranged in such way that their planes of symmetry PS1, PS2, PS3, PS4 are parallel or identical. By these features offset errors may be further reduced.

According to a preferred embodiment of the invention the first contacts 2.1.1, 2.2.1, 2.3.1, 2.4.1, of the first Hall effect region 2.1, the second Hall effect region 2.2, the third Hall effect region 2.3 and the fourth Hall effect region 2.4 are facing away from the respective plane of symmetry in a same direction, wherein the second contacts 2.1.2, 2.2.2, 2.3.2, 2.4.2 of the first Hall effect region 2.1, the second Hall effect region 2.2, the third Hall effect region 2.3 and the fourth Hall effect region 2.4 are facing away from the respective plane of symmetry PS1, PS2, PS3, PS4 in an opposite direction.

According to a preferred embodiment of the invention low ohmic is defined as: having an electrical conductivity which is at least 10 times, preferred at least 30 times, more preferred at least 100 times of the conductivity of the Hall effect regions 2.1, 2.2, 2.3, 2.4.

FIG. 1a shows a slightly modified schematic, cross-sectional view of the first embodiment of a vertical Hall effect device comprising four Hall effect regions. In FIG. 1a the first contacts 2.1.1, 2.2.1, 2.3.1, 2.4.1 and the second contacts 2.1.2, 2.2.2, 2.3.2, 2.4.2 as well as the Hall effect regions 2.1, 2.2, 2.3, 2.4 are symmetrically with respect to the planes of symmetry PS1, PS2, PS3, PS4. In contrast to FIG. 1, the Hall effect regions 2.1, 2.2, 2.3, 2.4 extend on both sides further away from the respective plane of symmetry PS1, PS2, PS3, PS4 then the first contacts 2.1.1, 2.2.1, 2.3.1, 2.4.1 or the second contacts 2.1.2, 2.2.2, 2.3.2, 2.4.2 respectively.

FIG. 1b shows a further slightly modified schematic, cross-sectional view of the first embodiment of a vertical Hall effect device comprising four Hall effect regions. In FIG. 1 the first contacts 2.1.1, 2.2.1, 2.3.1, 2.4.1 and the second contacts 2.1.2, 2.2.2, 2.3.2, 2.4.2 are symmetrically with respect to the planes of symmetry PS1, PS2, PS3, PS4. In contrast to FIG. 1, the Hall effect regions 2.1, 2.2, 2.3, 2.4 extend on one side further away from the respective plane of symmetry PS1, PS2, PS3, PS4 then the first contacts 2.1.1, 2.2.1, 2.3.1, 2.4.1 or the second contacts 2.1.2, 2.2.2, 2.3.2, 2.4.2 respectively. That means that the Hall effect regions 2.1, 2.2, 2.3, 2.4 are not symmetrically with respect to the planes of symmetry PS1, PS2, PS3, PS4.

FIG. 2 shows a schematic, cross-sectional view of the first embodiment of the vertical Hall device used in a first mode of operation.

FIG. 3 shows a schematic, cross-sectional view of the first embodiment of the vertical Hall device used in a second mode of operation.

FIG. 4 shows a schematic, cross-sectional view of the first embodiment of the vertical Hall device used in a third mode of operation.

FIG. 5 shows a schematic, cross-sectional view of the first embodiment of the vertical Hall device used in a fourth mode of operation.

In a preferred embodiment the vertical Hall effect device 1 comprises an energy supply and measuring circuit configured to supply the at least four Hall effect regions 2.1, 2.2, 2.3, 2.4 with electrical energy I1, I2, I3, I4 and configured to measure at least one electrical Hall effect output signal Vout1, Vout2 responsive to a magnetic field H.

In a preferred embodiment the energy supply and measuring circuit is configured to supply the electrical energy to a first specific contact and a second specific contact of the first contacts and/or second contacts 2.1.1, 2.2.1, 2.3.1, 2.4.1, 2.1.2, 2.2.2, 2.3.2, 2.4.2 wherein the specific contacts are chosen differently in different modes of operation.

In a preferred embodiment the energy supply and measuring circuit is configured to measure the at least one electrical Hall output signal Vout1, Vout2 responsive to a magnetic field H at a third specific contact of the first contacts and/or second contacts and at a fourth specific contact of the first contacts and/or second contacts 2.1.1, 2.2.1, 2.3.1, 2.4.1, 2.1.2, 2.2.2, 2.3.2, 2.4.2, and wherein the specific contacts are chosen differently in different modes of operation. With other words spinning scheme may be applied to the four Hall effect regions 2.1, 2.2, 2.3, 2.4. This reduces the offset error (=zero point error) of the vertical Hall effect device 1 and gives a strong signal responsive to the applied magnetic field in the indicated direction (perpendicular to the drawing plane).

According to a preferred embodiment each of the first contacts 2.1.1, 2.2.1, 2.3.1, 2.4.1, 2.1.2 and each of the second contacts 2.1.2, 2.2.2, 2.3.2, 2.4.2 of the at least four Hall effect regions 2.1, 2.2, 2.3, 2.4 are connected individually to the energy supply and measuring circuit.

In a preferred embodiment the energy supply and measuring circuit is configured
in such a way that in a first mode of operation (phase 1)
a first current I1 is input to the first contact 2.1.1 of the first Hall effect region 2.1,
a second current I2 is input to the second contact 2.2.2 of the second Hall effect region 2.1
a third current I3 is output at the first contact 2.3.1 of the third Hall effect region 2.3,
a fourth current I4 is output at the second contact 2.4.2 of the fourth Hall effect region 2.4,
a first Hall voltage Vout1 is measured from the first contact 2.2.1 of the second Hall effect region 2.2 to the second contact 2.1.2 of the first Hall effect region 2.1,
a second Hall voltage Vout2 is measured from the second contact 2.3.2 of the third Hall effect region 2.3 to the first contact 2.4.1 of the fourth Hall effect region 2.4, and/or in such way that in a second mode of operation (phase 2)
a first current I1 is input to the second contact 2.1.2 of the first Hall effect region 2.1,
a second current I2 is input to the first contact 2.2.1 of the second Hall effect region 2.2,
a third current I3 is output at the second contact 2.3.1 of the third Hall effect region 2.3,
a fourth current I4 is output at the first contact 2.4.1 of the fourth Hall effect region 2.4,
a first Hall output voltage Vout1' is measured from the first contact 0.1 0.1 of the first Hall effect region 2.1 to the second contact 2.2.2 of the second Hall effect region 2.2,
a second Hall voltage Vout2' is measured from the second contact 2.4.2 of the fourth Hall effect region 2.4 to the first contact 2.3.1 of the third Hall effect region 2.3, and/or in such way that in a third mode of operation (phase 3)
a first current I1 is input to the first contact 2.3.1 of the third Hall effect region 2.3, a second current I2 is input to the second contact 2.4.2 of the fourth Hall effect region 2.4,
a third current I3 is output at the first contact 2.1.1 of the first Hall effect region 2.1,
a fourth current I4 is output at the second contact 2.2.2 of the second Hall effect region 2.2,
a first Hall voltage Vout1" is measured from the second contact 2.1.2 of the first Hall effect region 2.1 to the first contact 2.2.1 of the second Hall effect region 2.2,
a second Hall voltage Vout2" is measured from the first contact 2.4.1 of the fourth Hall effect region 2.4 to the second contact 2.3.2 of the third Hall effect region 2.3,
and/or in such way that in a fourth mode of operation
a first current I1 is input to the second contact 2.3.1 of the third Hall effect region 2.3,
a second current I2 is input to the first contact 2.4.1 of the fourth Hall effect region 2.4,
a third current I3 is output at the second contact 2.1.2 of the first Hall effect region 2.1,
a fourth current I4 is output at the first contact 2.2.1 of the second Hall effect region 2.2,
a first Hall voltage Vout1''' is measured from the second contact 2.2.2 of the second Hall effect region 2.2 to the first contact 2.1.1 of the first Hall effect region 2.1,
an second Hall voltage Vout1''' is measured from the first contact 2.3.1 of the third Hall effect region 2.3 to the second contact 2.4.2 of the fourth Hall effect region 2.4.

In a preferred embodiment of the invention the energy supply and measuring circuit is configured to execute a measuring cycle having a first phase in which the device operates in the first mode of operation and having a second phase in which the device operates in the second mode of operation, wherein measurement results of the first phase and measurement results of the second phase are combined, or wherein the energy supply and measuring circuit is configured to execute a measuring cycle having a first phase in which the device operates in the third mode of operation and having a second phase in which the device operates in the fourth mode of operation, wherein measurement results of the first phase and measurement results of the second phase are combined,
or wherein the energy supply and measuring circuit is configured to execute a measuring cycle having a first phase in which the device operates in the first mode of operation, having a second phase in which the device operates in the second mode of operation, having a third phase in which the device operates in the third mode of operation and a fourth phase in which the device operates in the fourth mode of operation, wherein measurement results of the first phase and measurement results of the second phase and measurement results of the third phase and measurement results of the fourth phase are combined.

If the first and the second mode of operation are used in a measuring cycle or if the third and the fourth mode of operation are used in a measuring cycle, offset errors may be reduced.

In case that all four modes of operation are used subsequently offset errors are reduced efficiently because it additionally cancels thermo offsets.

According to a preferred embodiment at least one of said low ohmic connection paths 6 is electrically connected to a biasing voltage source 7. This feature addresses the problem that the potential of the contacts of the four Hall regions 2.1, 2.2, 2.3, 2.4 might sink below ground, which is not allowed in many semiconductor technology is, because it would open reverse biased isolation of devices to a substrate.

In phase 1 the currents are injected into the current terminals in the first portion whereas they are extracted from the current terminals in the second portion. In phase 2 the first contacts and the second contacts are exchanged compared to phase 1. In phase 3 only the current directions are reversed. In phase 4 the first and the second contacts are exchanged compared to phase 3. The signals may be combined by adding them.

According to a preferred embodiment of the invention the first Hall effect region 2.1, the second Hall effect region 2.2, the third Hall effect region 2.3 and the fourth Hall effect region 2.4 are arranged on a common substrate.

FIG. 6 shows a schematic, cross-sectional view of a second embodiment of the vertical Hall device used in a first mode of operation.

FIG. 7 shows a schematic, cross-sectional view of the second embodiment of the vertical Hall device used in a third mode of operation.

The second mode of operation and the fourth mode of operation of the second embodiment of a vertical Hall device are not shown in the figures. However, they are equivalent to those of the first embodiment as shown in FIGS. 3 and 5.

According to a preferred embodiment of the invention at least one of said low ohmic connection paths 6 is electrically floating.

In each mode of operation one of the first or second contacts 2.1.1, 2.2.1, 2.3.1, 2.4.1, 2.1.2, 2.2.2, 2.3.2, 2.4.2 of the left Hall region regions 2.1, 2.2, 2.3, 2.4 is connected to a voltage source 7, which applies the potential Vg.

Figure 8:
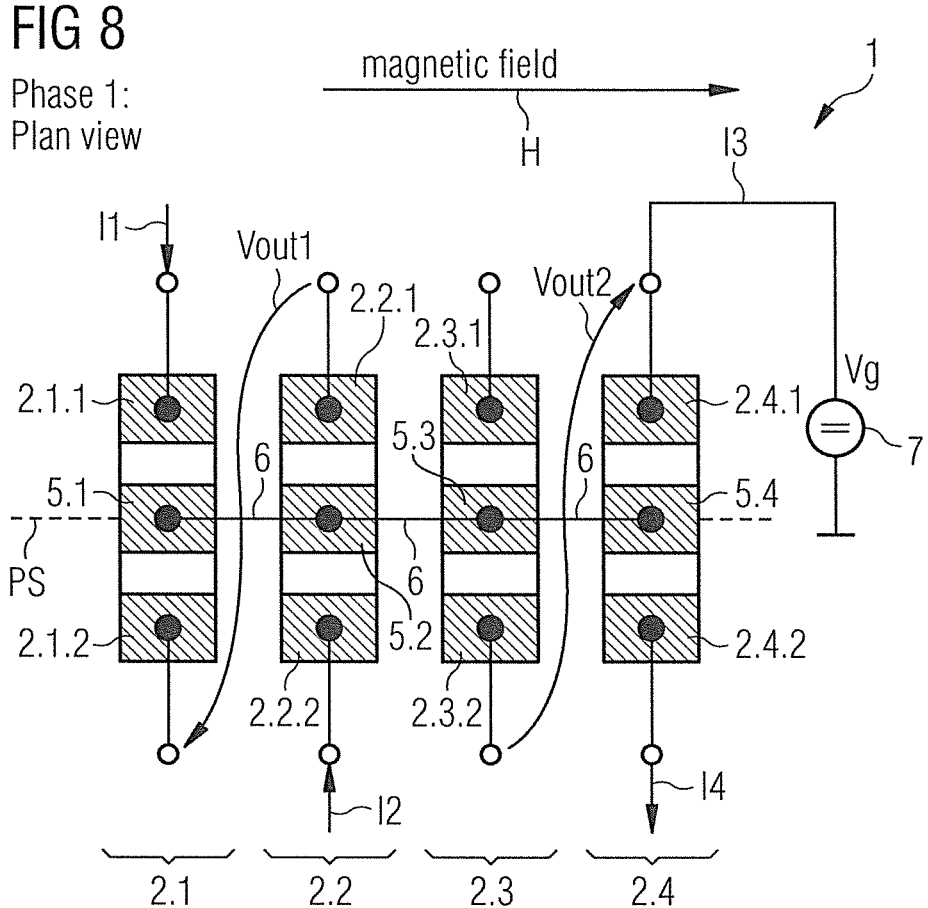
FIG. 8 shows a schematic top view of the second embodiment of a vertical Hall effect device used in the first mode of operation.

FIG. 8 shows a schematic top view of the second embodiment of a vertical Hall device 1 used in the first mode of operation. All Hall effect regions 2.1, 2.2, 2.3, 2.4 are essentially insulated from each other except for the connection path 6 that contacts the contact areas 5.1, 5.2, 5.3, 5.4 of all Hall effect regions 2.1, 2.2, 2.3, 2.4. A connection path 6 has the appearance of the backbone. Each Hall effect region may have an optional buried layer underneath. Alternatively there may be a single buried layer underneath all four Hall effect regions 2.1, 2.2, 2.3, 2.4.

Figure 9:
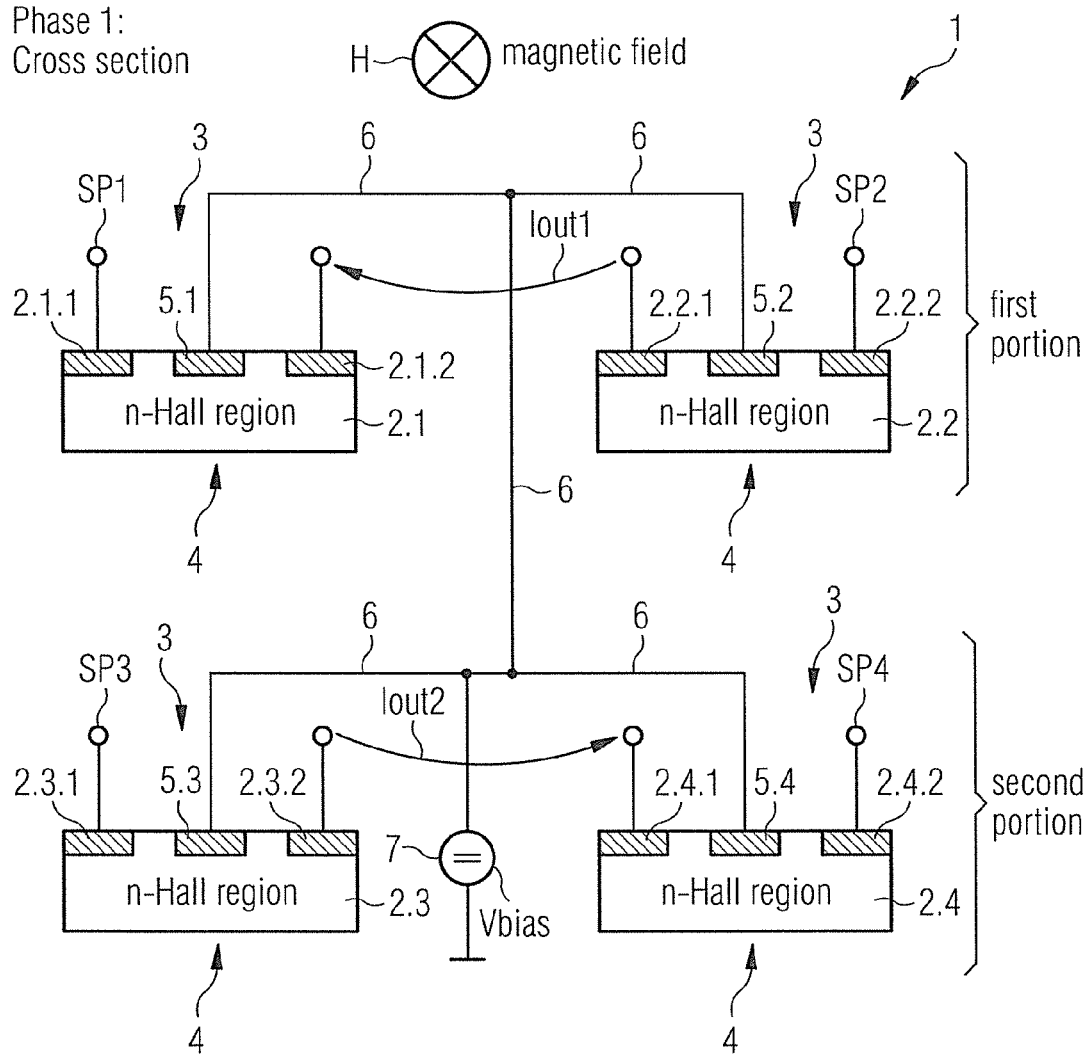
FIG. 9 shows a schematic, cross-sectional view of a third embodiment of the vertical Hall effect device used in a first mode of operation.

FIG. 9 shows a schematic, cross-sectional view of a third embodiment of the vertical Hall device used in a first mode of operation.

Figure 10:
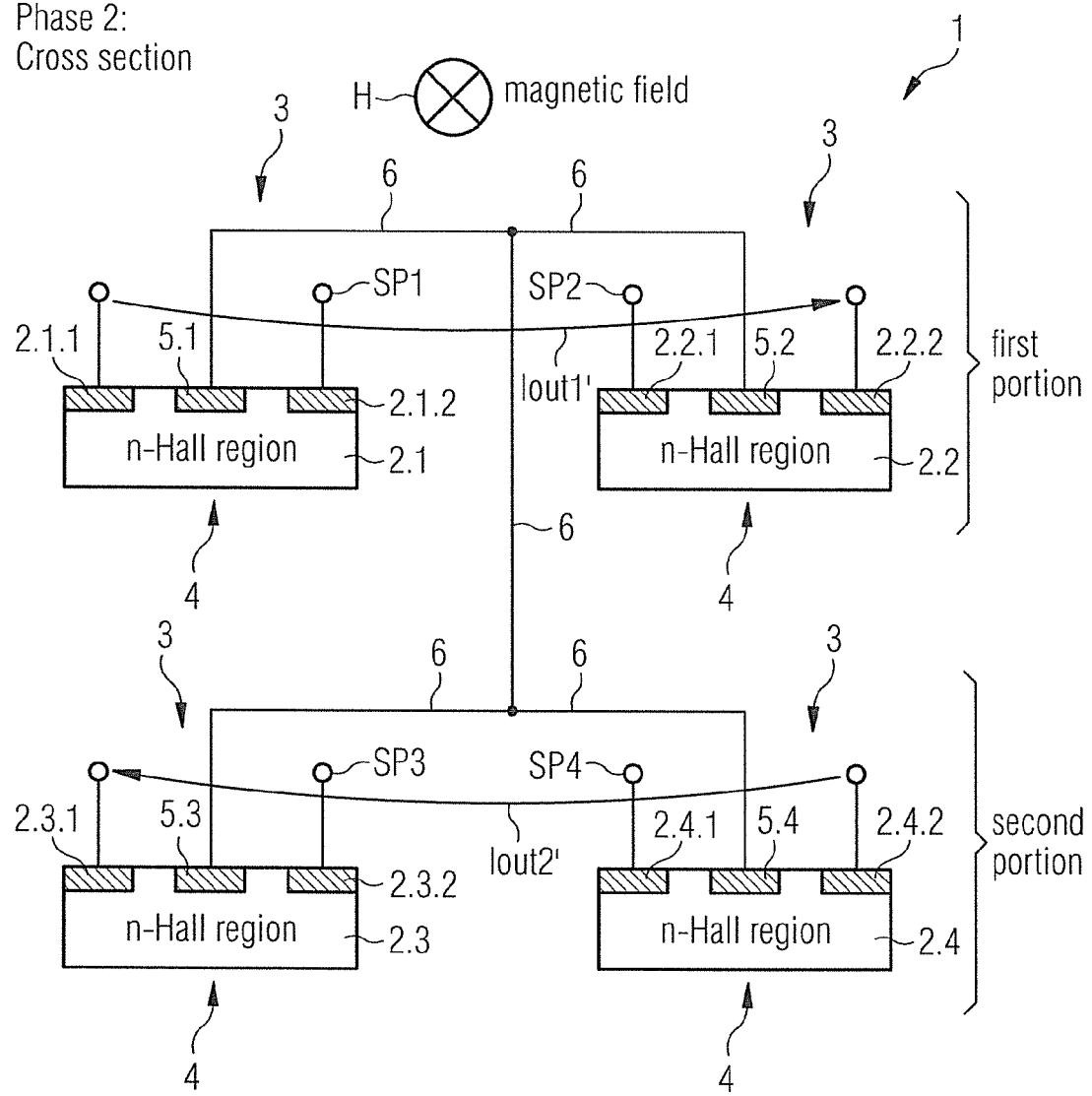
FIG. 10 shows a schematic, cross-sectional view of the third embodiment of the vertical Hall effect device used in a second mode of operation.

FIG. 10 shows a schematic, cross-sectional view of the third embodiment of the vertical Hall device used in a second mode of operation.

Figure 11:
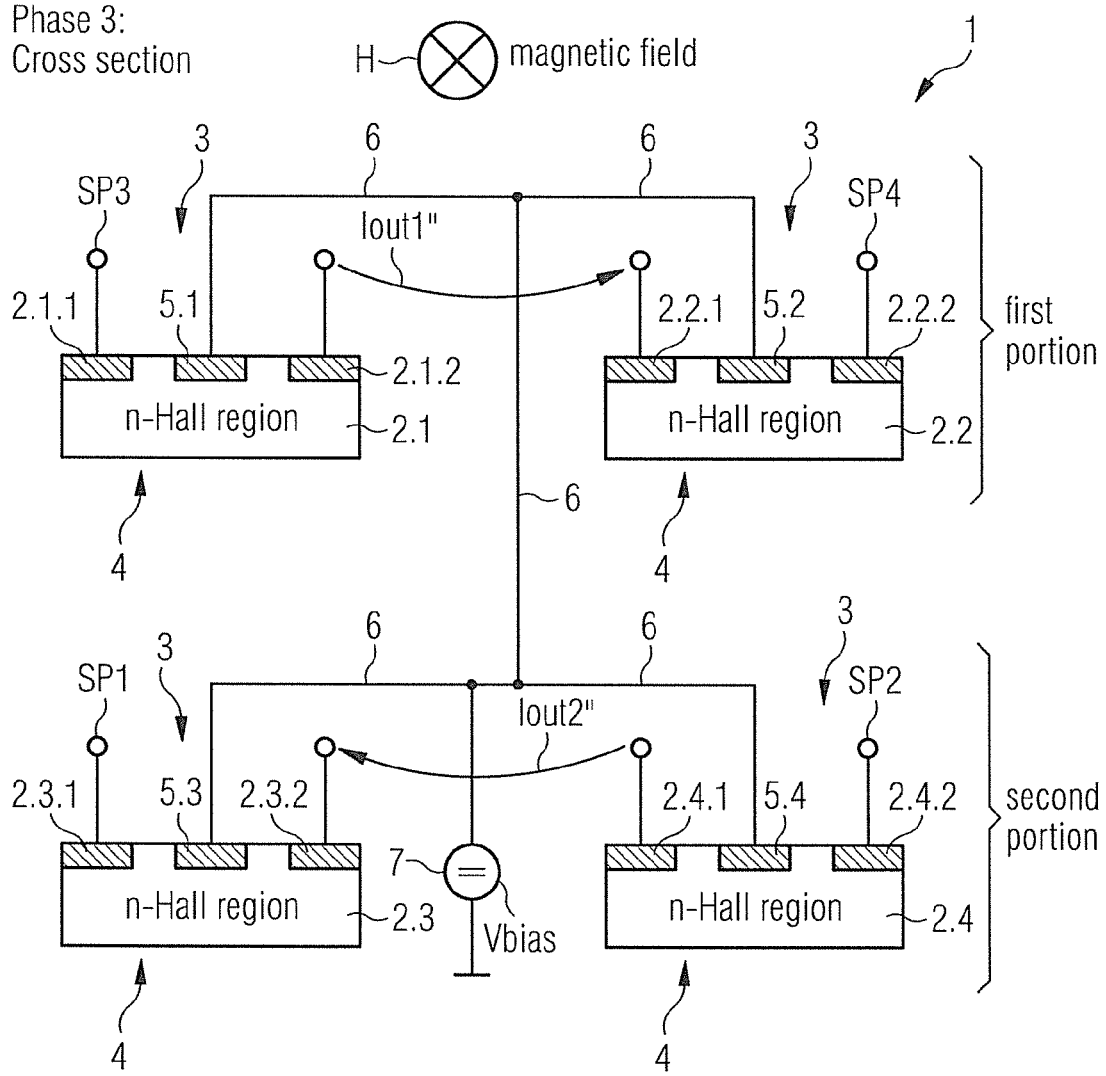
FIG. 11 shows a schematic, cross-sectional view of the third embodiment of the vertical Hall effect device used in a third mode of operation.

FIG. 11 shows a schematic, cross-sectional view of the third embodiment of the vertical Hall device used in a third mode of operation.

Figure 12:
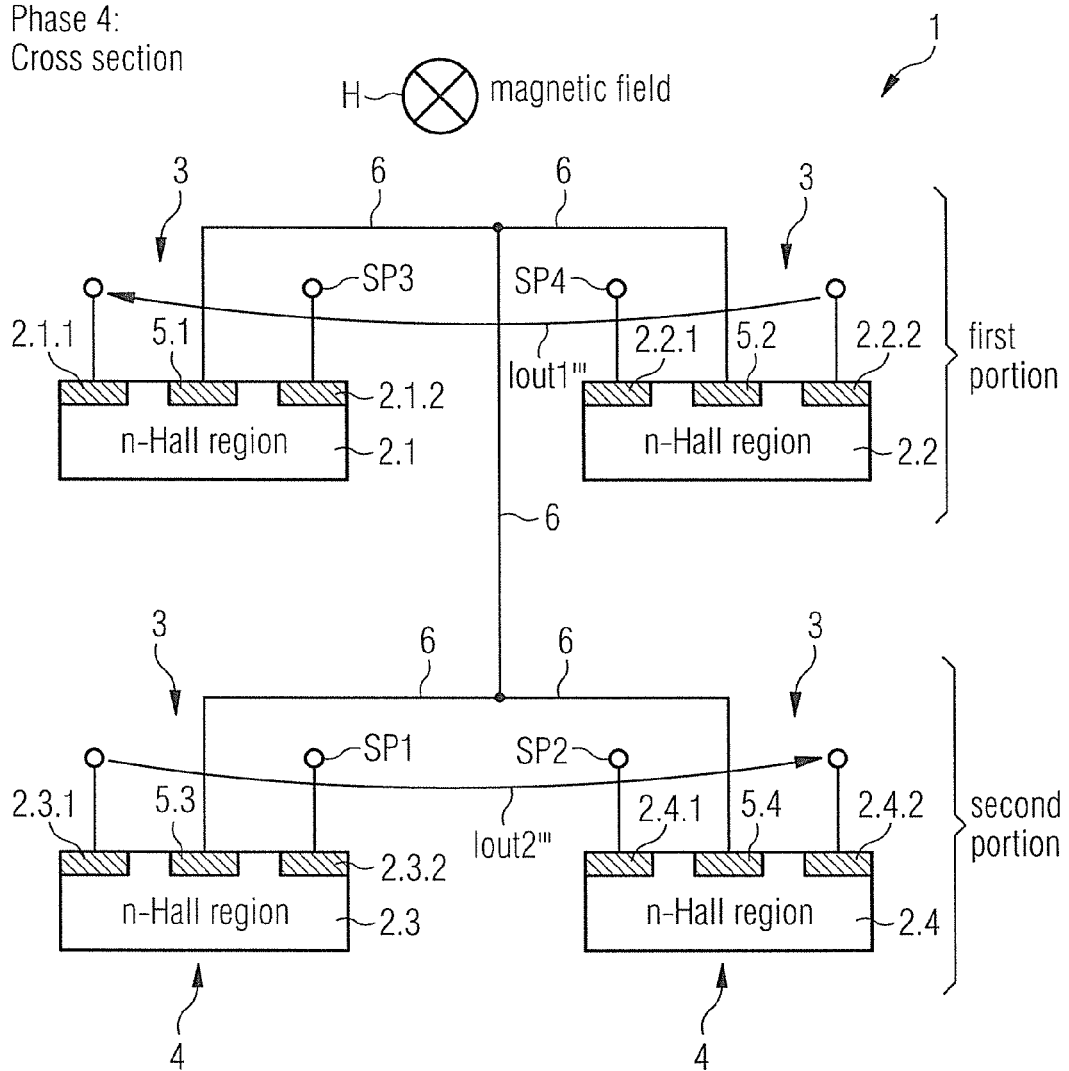
FIG. 12 shows a schematic, cross-sectional view of the third embodiment of the vertical Hall effect device used in a fourth mode of operation.

FIG. 12 shows a schematic, cross-sectional view of the third embodiment of the vertical Hall device used in a fourth mode of operation.

According to an embodiment of the invention the energy supply and measuring circuit is configured
in such a way that in a first mode of operation
a first supply potential SP1 is supplied to the first contact 2.1.1 of the first Hall effect region 2.1,
a second supply SP2 potential is supplied to the second contact 2.2.2 of the second Hall effect region 2.2,
a third supply potential SP3 is supplied to the first contact 2.3.1 of the third Hall effect region 2.3,
a fourth supply potential SP4 is supplied to the second contact 2.4.2 of the fourth Hall effect region 2.4,
a first output current Iout1 from the first contact 2.2.1 of the second Hall effect region 2.2 to the second contact 2.1.2 of the first Hall effect region 2.1 is measured, a second output current Iout2 from the second contact 2.3.2 of the third Hall effect region 2.3 to the first contact 2.4.1 of the fourth Hall effect region 2.4 is measured, and/or in such a way that in a second mode of operation a first supply potential SP1 is supplied to the second contact 2.1.2 of the first Hall effect region 2.1, a second supply potential SP2 is supplied to the first contact 2.2.1 of the second Hall effect region 2.1, a third supply potential SP3 is supplied to the second contact 2.3.2 of the third Hall effect region 2.3, a fourth supply potential SP4 is supplied to the first contact 2.4.1 of the fourth Hall effect region 2.4, a first output current Iout1' from the first contact 2.1.1 of the first Hall effect region 2.1 to the second contact 2.2.2 of the second Hall effect region 2.1 is measured, a second output current Iout2' from the second contact 2.4.2 of the fourth Hall effect region 2.4 to the first contact 2.3.1 of the third Hall effect region 2.3 is measured, and/or in such way that in a third mode of operation a first supply potential SP1 is supplied to the first contact 2.3.1 of the third Hall effect region 2.3, a second supply potential SP2 is supplied to the second contact 2.4.2 of the fourth Hall effect region 2.4, a third supply potential SP3 is supplied to the first contact 2.1.1 of the first Hall effect region 2.1, a fourth supply potential SP 4 is supplied to the second contact 2.2.2 of the second Hall effect region 2.2, a first output current Iout1" from the second contact 2.1.2 of the first Hall effect region 2.1 to the first contact 2.2.1 of the second Hall effect region 2.2 is measured, a second output current Iout2" from the first contact 2.4.1 of the fourth Hall effect region 2.4 to the second contact 2.3.2 of the third Hall effect region is measured 2.3, and/or in such way that in a fourth mode of operation a first supply potential SP1 is supplied to the second contact 2.3.2 of the third Hall effect region 2.3, a second supply potential SP2 is supplied to the first contact 2.4.1 of the fourth Hall effect region 2.4, a third supply potential SP3 is supplied to the second contact 2.1.2 of the first Hall effect region 2.1, a fourth supply potential SP4 is supplied to the first contact 2.2.1 of the second Hall effect region 2.2, a first output current Iout1''' is measured from the second contact 2.2.2 of the second Hall effect region 2.2 to the first contact 2.1.1 of the first Hall effect region 2.1, an second output current Iout2''' is measured from the first contact 2.3.1 of the third Hall effect region 2.3 to the second contact 2.4.2 of the fourth Hall effect region.

The third embodiment differs from the second embodiment in that, instead of currents I1, I2, I3, I4, supply potentials SP1, SP2, SP3, SP4 are input into the Hall effect regions 2.1, 2.2, 2.3, 2.4. Furthermore, instead of the voltages Vout1, Vout2, currents Iout1, Iout2 are tapped from the Hall effect regions 2.1, 2.2, 2.3, 2.4.

Figure 13:
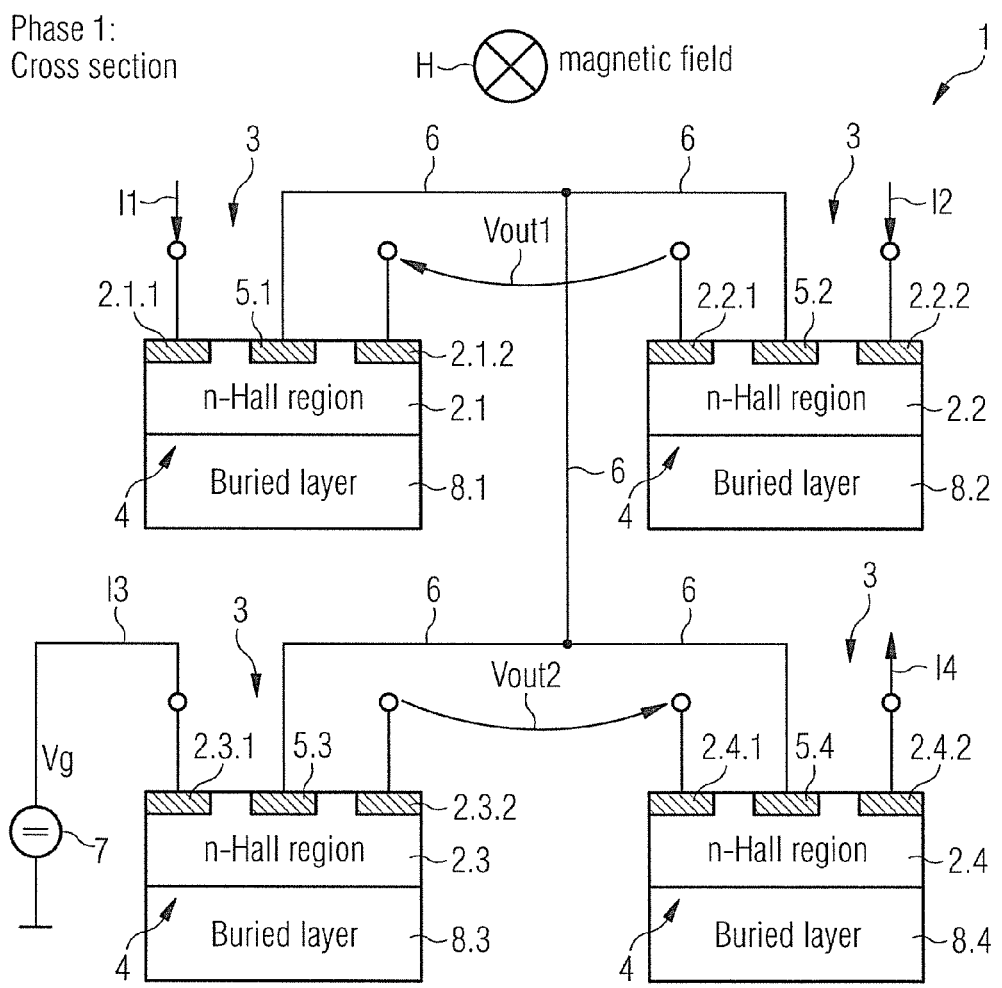
FIG. 13 shows a schematic, cross-sectional view of a fourth embodiment of the vertical Hall effect device used in a first mode of operation.

FIG. 13 shows a schematic, cross-sectional view of a fourth embodiment of the vertical Hall device used in a first mode of operation. In this embodiment of the invention a first buried layer 8.1 is in ohmic contact with the second face 4 of the first Hall effect region 2.1. Furthermore, a second buried layer 8.2 is in ohmic contact with the second face 4 of the second Hall effect region 2.2. In the same way, a third buried layer 8.3 is connected to the third Hall effect region 2.3 as well as a fourth buried layer 8.4 is connected to the fourth Hall effect region 2.4.

Figure 14:
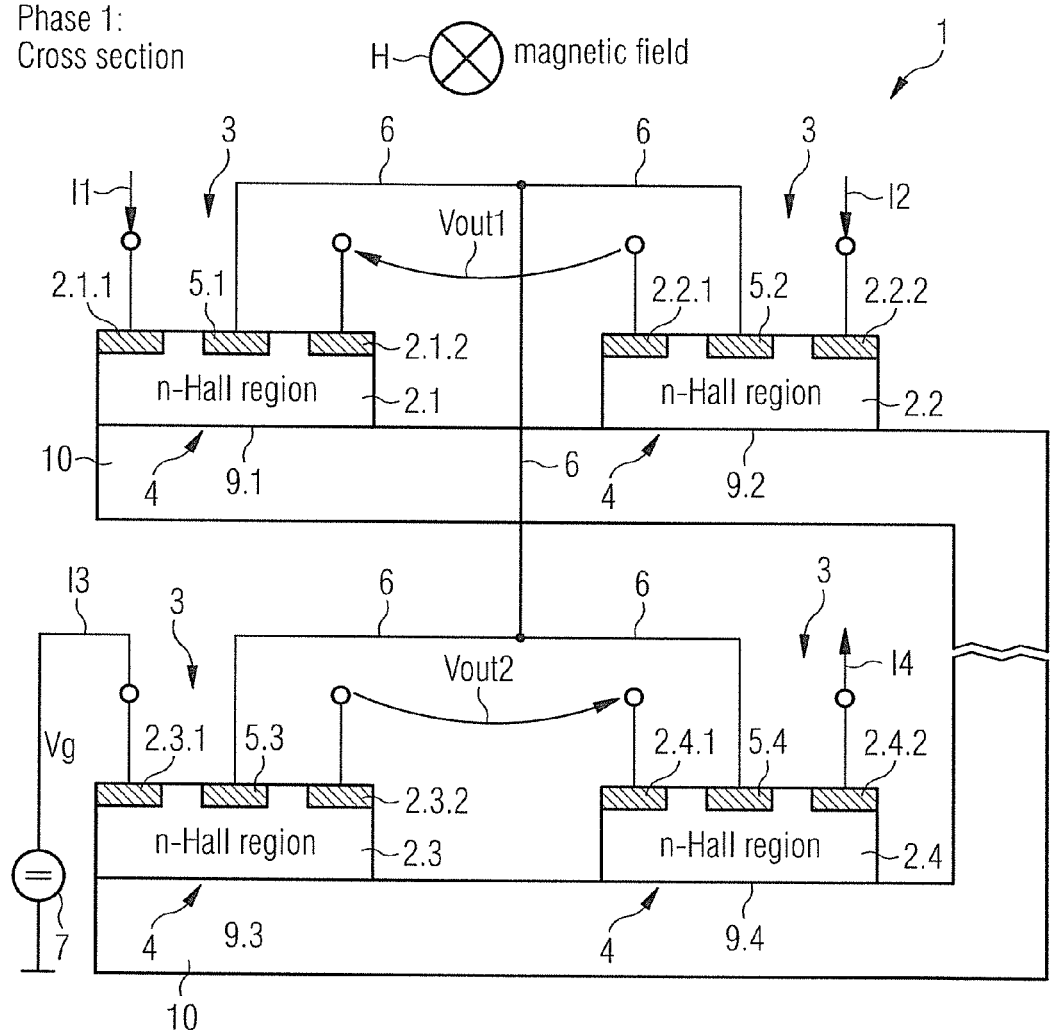
FIG. 14 shows a schematic, cross-sectional view of a fifth embodiment of the vertical Hall effect device used in a second mode of operation.

FIG. 14 shows a schematic, cross-sectional view of a fifth embodiment of the vertical Hall device used in a second mode of operation.

According to a preferred embodiment of the invention each of the at least four Hall effect regions 2.1, 2.2, 2.3, 2.4 has one of said contact areas 9.1, 9.2, 9.3, 9.4 arranged on the second face 4 and the contact areas 9.1,9.2, 9.3, 9.4 arranged on the second face 4 are connected by a low ohmic connecting path 10 comprising a low ohmic layer structure 10 or wherein each of the at least four Hall effect regions 2.1, 2.2, 2.3, 2.4 has one of said contact areas 9.1,9.2, 9.3, 9.4 arranged between the first face 3 and the second face 4 and the contact areas arranged between the first face 3 and the second face 4 are connected by a low ohmic connecting path 10 comprising a low ohmic layer structure 10.

FIG. 15 shows a schematic, plan view and a schematic, cross-sectional view of the 5th embodiment of the vertical Hall device. According to a preferred embodiment of the invention the low ohmic layer structure 10 comprises a buried layer 10.

For the sake of clarity the low ohmic connection path 6 is not shown in the cross-sectional view. Evidently, the buried layer 10 does not act differently than the connection path 6: it simply improves the short between the center parts of 4 Hall effect regions 2.1, 2.2, 2.3, 2.4. Therefore, it is also possible to skip the connection path 6, if the short is established by the common buried layer 10.

FIG. 16 shows a schematic, plan view and a schematic, cross-sectional view of a sixth embodiment of the vertical Hall device.

According to a preferred embodiment of the invention at least two of the Hall effect regions 2.1, 2.2, 2.3, 2.4 are arranged in a row 12, wherein neighboring Hall effect regions 2.1, 2.2, 2.3, 2.4 of the row 12 are spaced by a respective resistive bridge portion 11.1, 11.2, 11.3. These features may improve the short between the centers of the Hall effect regions 2.1, 2.2, 2.3, 2.4.

According to a preferred embodiment of the invention at least two of the Hall effect regions 2.1, 2.2, 2.3, 2.4 are at least partially decoupled along a minimum distance in a top view between the contacts 2.1.1, 2.2.1, 2.3.1, 2.4.1, 2.1.2, 2.2.2, 2.3.2, 2.4.2 of the two Hall effect regions 2.1, 2.2, 2.3, 2.4 by a trench-wall coated with an insulating thin film.

FIG. 17 shows a schematic, plan view and a schematic, cross-sectional view of a seventh embodiment of the vertical Hall device.

According to a preferred embodiment of the invention resistive ending portions 13.1, 13.2 having a similar geometry and/or comprising a similar material as the bridge portion 11.1, 11.2, 11.3 are attached to both ends of the row 12. This ensures a symmetric behavior of the vertical Hall effect device 1, especially when spinning schemes are used during operation of the device 1.

Of course the buried layer 10 may be skipped optionally. The idea is to pattern the vertical Hall regions 2.1, 2.2, 2.3, 2.4 such that all center areas are shorted efficiently while the outer contacts 2.1.1, 2.2.1, 2.3.1, 2.4.1, 2.1.2, 2.2.2, 2.3.2, 2.4.2 are decoupled efficiently: The current should not flow from one outer contact of a Hall effect region 2.1, 2.2, 2.3, 2.4 to an outer contact 2.1.1, 2.2.1, 2.3.1, 2.4.1, 2.1.2, 2.2.2, 2.3.2, 2.4.2 of another Hall effect region 2.1, 2.2, 2.3, 2.4. It should rather flow between each outer contact and the central part of the structure (=the backbone=the contact areas 5.1, 5.2, 5.3, 5.4 plus nearby Hall region plus low ohmic connection path 10 at the second face plus low ohmic connection path 6 at the first face).

FIG. 18 shows a schematic, plan view and a schematic, cross-sectional view of an eighth embodiment of the vertical Hall effect device.

According to a preferred embodiment of the invention at least two of the Hall effect regions 2.1, 2.2, 2.3, 2.4 are at least partially decoupled along a minimum distance in a top view between the contacts 2.1.1, 2.2.1, 2.3.1, 2.4.1, 2.1.2, 2.2.2, 2.3.2, 2.4.2 of the two Hall effect regions 2.1, 2.2, 2.3, 2.4 by a reverse biased pn-junction 14. The decoupling may also be done by reverse biased p-tubs, whereby these p-tubs 14 should ideally reach as deep as the Hall effect region 2.1, 2.2, 2.3, 2.4, yet if this is not possible due to limitation of the technology they may also be shallower.

Of course the position of the Hall effect regions 2.1, 2.2, 2.3, 2.4 in the direction of the magnetic field may H be changed. The positions of Hall regions 2.1, 2.2, 2.3, 2.4 from left to right in FIG. 18 are 2.1, 2.2, 2.3, 2.4, yet it may also be 2.1, 2.3, 2.2, 2.4 or 2.1, 2.4, 2.3, 2.2 or 2.1, 2.4, 2.2, 2.3 or 2.2, 2.3, 2.4, 2.1 or 2.4, 2.1, 2.3, 2.2 or . . . in general arbitrary.

Figure 19:
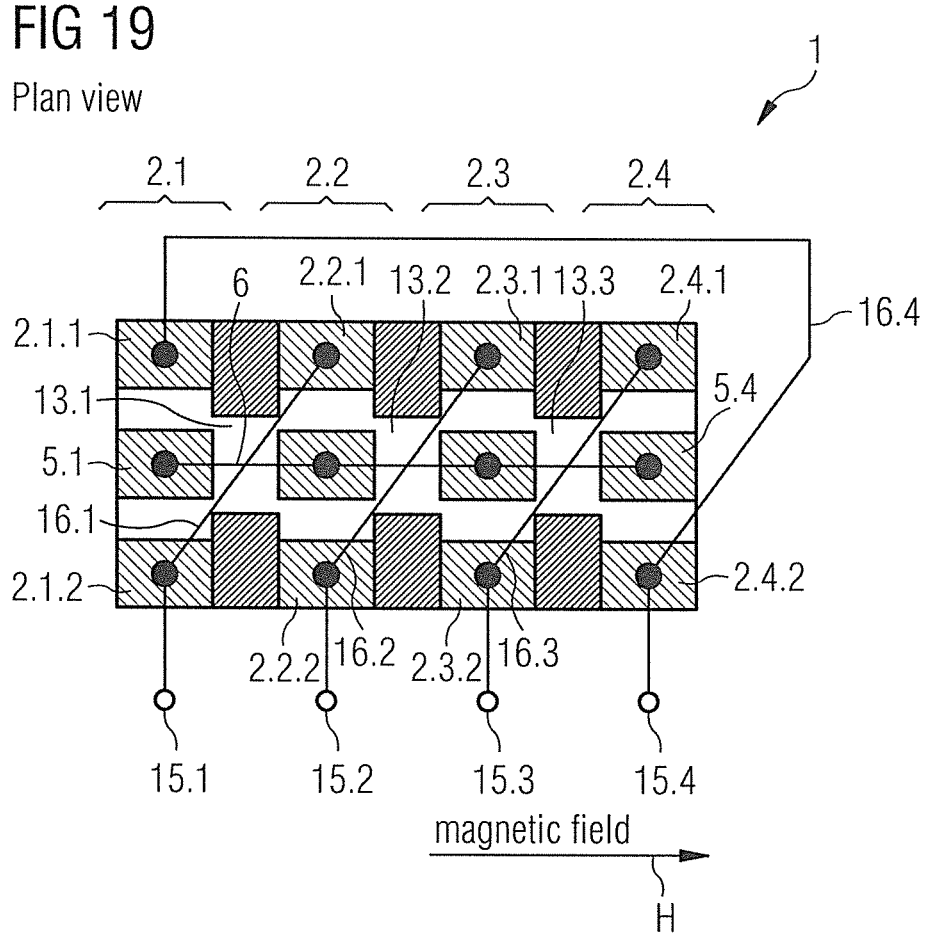
FIG. 19 shows a schematic, plan view and a schematic, cross-sectional view of a ninth embodiment of the vertical Hall effect device.

FIG. 19 shows a schematic, plan view and a schematic, cross-sectional view of a ninth embodiment of the vertical Hall effect device.

According to a preferred embodiment of the invention each of the first contacts 2.1.1, 2.2.1, 2.3.1, 2.4.1 and each of the second contacts 2.1.2, 2.2.2, 2.3.2, 2.4.2 of the at least four Hall effect regions 2.1, 2.2, 2.3, 2.4 are connectable or connected via a first terminal 15.1, a second terminal 15.2, a third terminal 15.3 and a fourth terminal 15.4 to the energy supply and measuring circuit, wherein the first terminal 15.1 is connectable or connected to the second contact 2.1.2 of the first Hall effect region 2.1 and to the first contact 2.2.1 of the second Hall effect region 2.2, wherein the second terminal 15.2 is connectable or connected to the second contact 2.2.2 of the second Hall effect region 2.2 and to the first contact 2.3.1 of the third Hall effect region 2.3, wherein the third terminal 15.3 is connectable or connected to the second contact 2.3.2 of the third Hall effect region 2.3 and to the first contact 2.4.1 of the forth Hall effect region 2.4, wherein the fourth terminal 15.4 is connectable or connected to the second contact 2.4.2 of the fourth Hall effect region 2.4 and to the first contact 2.1.1 of the first Hall effect region 2.1.

A further modification of these vertical Hall effect devices 1 is to short two contacts, which exhibit the same polarity of voltage excursion when a magnetic field is switched on. If the embodiments above are considered, there are four signal contacts, whereby two signal contacts have a common mode potential higher than the potential of the electrically floating low ohmic connection structure 6, 10, whereby the two other signal contacts have a common mode potential lower than the potential of low ohmic connection structure 6, 10. One of the two signal contacts at high common mode potential increases with increasing magnetic field, while the other one decreases at the same time. One of the two signal contacts at low common mode potential increases with increasing magnetic field, while the other one decreases at the same time. So those two terminals which show increasing potential with increasing magnetic field may be shorted. Also those two terminals which show decreasing potential with increasing magnetic field may be shorted. Since the common mode potentials of the two contacts which are shorted were different (prior to shortening) a certain current will flow through these shorts, yet this is only a part of the total current through the vertical Hall device 1.

It has to be noted that the backbone also has the advantage to reduce the currents flowing in the connecting elements 16.1, 16.2, 16.3, 16.4, which short the two contacts per terminal 15.1, 15.2, 15.3, 15.4, because most current flows over the backbone 6, 10, 13.1, 13.2, 13.3. It is advantageous to have only small current flowing between the two contacts that are connected to the same terminal when this terminal is a sense terminal, because any significant current over signal terminals gives rise to thermally induced offset errors (e.g. via the Peltier-effect).

According to a preferred embodiment of the invention the energy supply and measuring circuit is configured
in such a way that in a first mode of operation
the first terminal 15.1 and the third terminal 15.3 are used to supply the Hall effect regions 2.1, 2.2, 2.3, 2.4 with the electrical energy, and the second terminal 15.2 and the fourth terminal 15.4 are used for tapping the electrical Hall output signal responsive to the magnetic field H, and
in such a way that in a second mode of operation
the second terminal 15.2 and the fourth terminal 15.4 are used to supply the Hall effect regions 2.1, 2.2, 2.3, 2.4 with the electrical energy, and the third terminal 15.3 and the first terminal 15.1 are used for tapping the electrical Hall output signal responsive to the magnetic field H.

According to a preferred embodiment of the invention the energy supply and measuring circuit is configured to execute a measuring cycle having a first phase in which the device operates in the first mode of operation and having a second phase in which the device operates in the second mode of operation, wherein measurement results of the first phase and measurement results of the second phase are combined,
or
wherein the energy supply and measuring circuit is configured to execute a measuring cycle having a first phase in which the device operates in the third mode of operation and having a second phase in which the device operates in the fourth mode of operation, wherein measurement results of the first phase and measurement results of the second phase are combined,
or wherein the energy supply and measuring circuit is configured to execute a measuring cycle having a first phase in which the device operates in the first mode of operation, having a second phase in which the device operates in the second mode of operation, having a third phase in which the device operates in the third mode of operation and a fourth phase in which the device operates in the fourth mode of operation, wherein measurement results of the first phase and measurement results of the second phase and measurement results of the third phase and measurement results of the fourth phase are combined.

Figure 20:
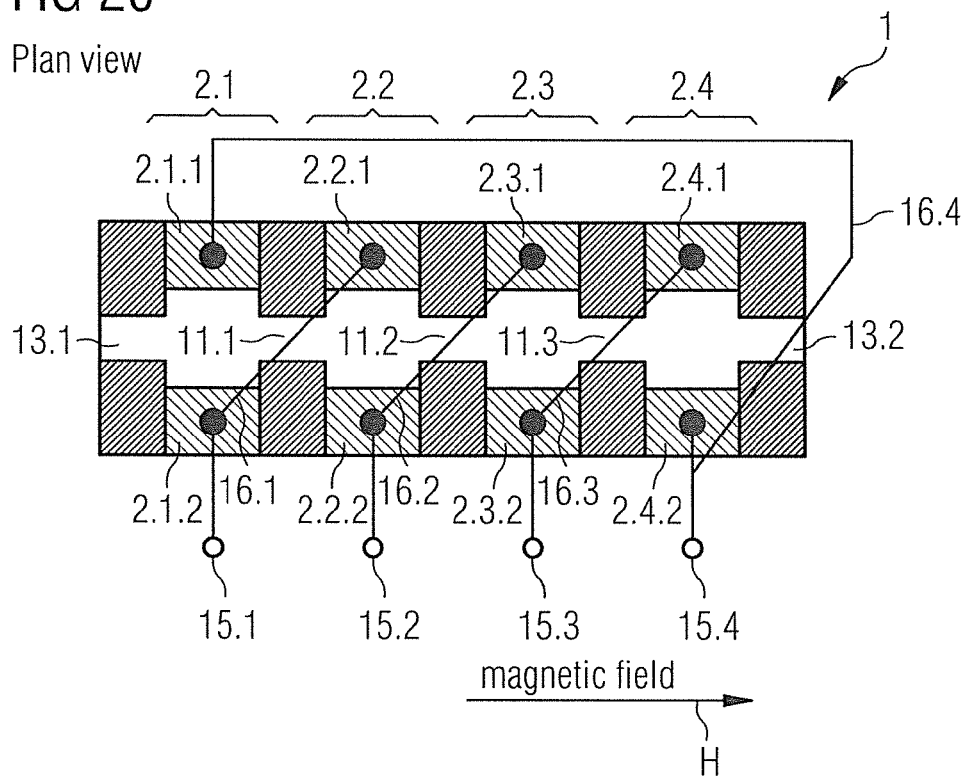
FIG. 20 shows a schematic, plan view and a schematic, cross-sectional view of a tenth embodiment of the vertical Hall effect device.

FIG. 20 shows a schematic, plan view and a schematic, cross-sectional view of a tenth embodiment of the vertical Hall effect device 1. In the above example the back-bone structure connecting the four Hall regions 2.1, 2.2, 2.3, 2.4 is composed of the connection wire 6, the buried layer 10 and the bridge-portions 11.1, 11.2, 11.3. One may reduce this back-bone structure e.g. by skipping the center contacts 5.1, 5.2, 5.3, 5.4 and the connection wire 6. In this embodiment the vertical Hall effect device 1 does not comprise a low ohmic connection path at the first face 3. Instead, the shortening is done by bridge portions 11.1, 11.2, 11.3 and a buried layer 10, which is not visible in the plane view. Optionally either the bridge portions 11.1, 11.2, 11.3 or the buried layer 10 may also be skipped.

Figure 21:
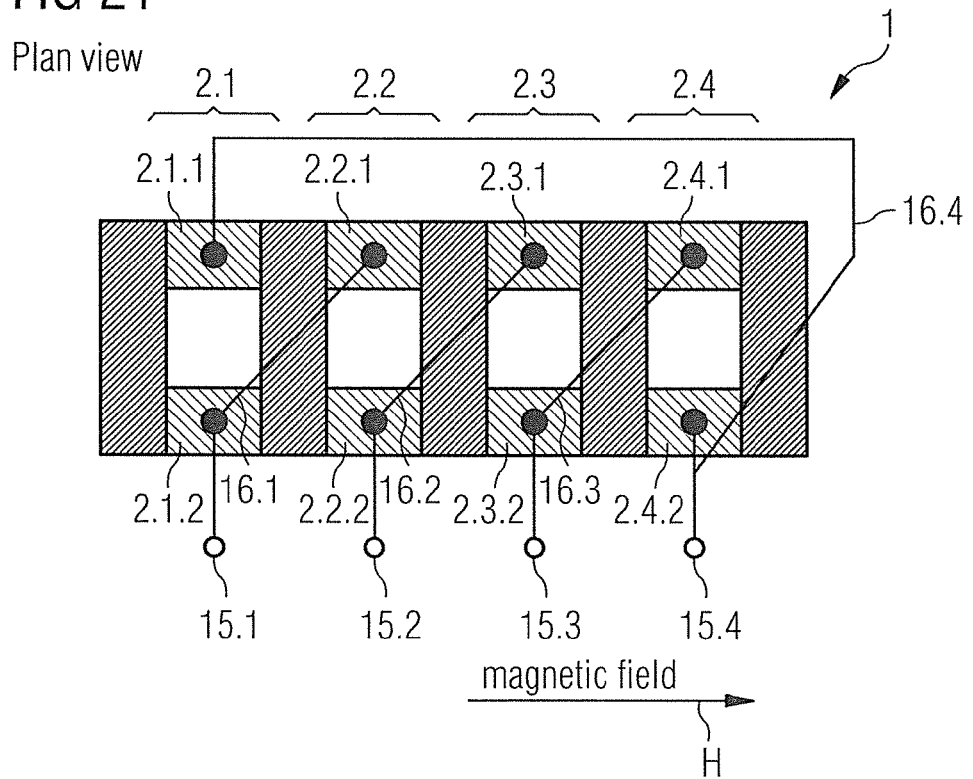
FIG. 21 shows a schematic, plan view and a schematic, cross-sectional view of an eleventh embodiment of the vertical Hall effect device.

FIG. 21 shows a schematic, plan view and a schematic, cross-sectional view of an eleventh embodiment of the vertical Hall device. In this embodiment also the bridge portions were skipped so that the Hall effect regions 2.1, 2.2, 2.3, 2.4 are connected only by the buried layer, which acts as a back-bone. If current flows into 15.1 and out of 15.3 it traverses the backbone, so in this case mainly the buried layer 10. Thereby it comes to a voltage excursion of the potentials at 15.2 and 15.4 proportional to the magnetic field H component parallel to the indicated direction.

Figure 22:
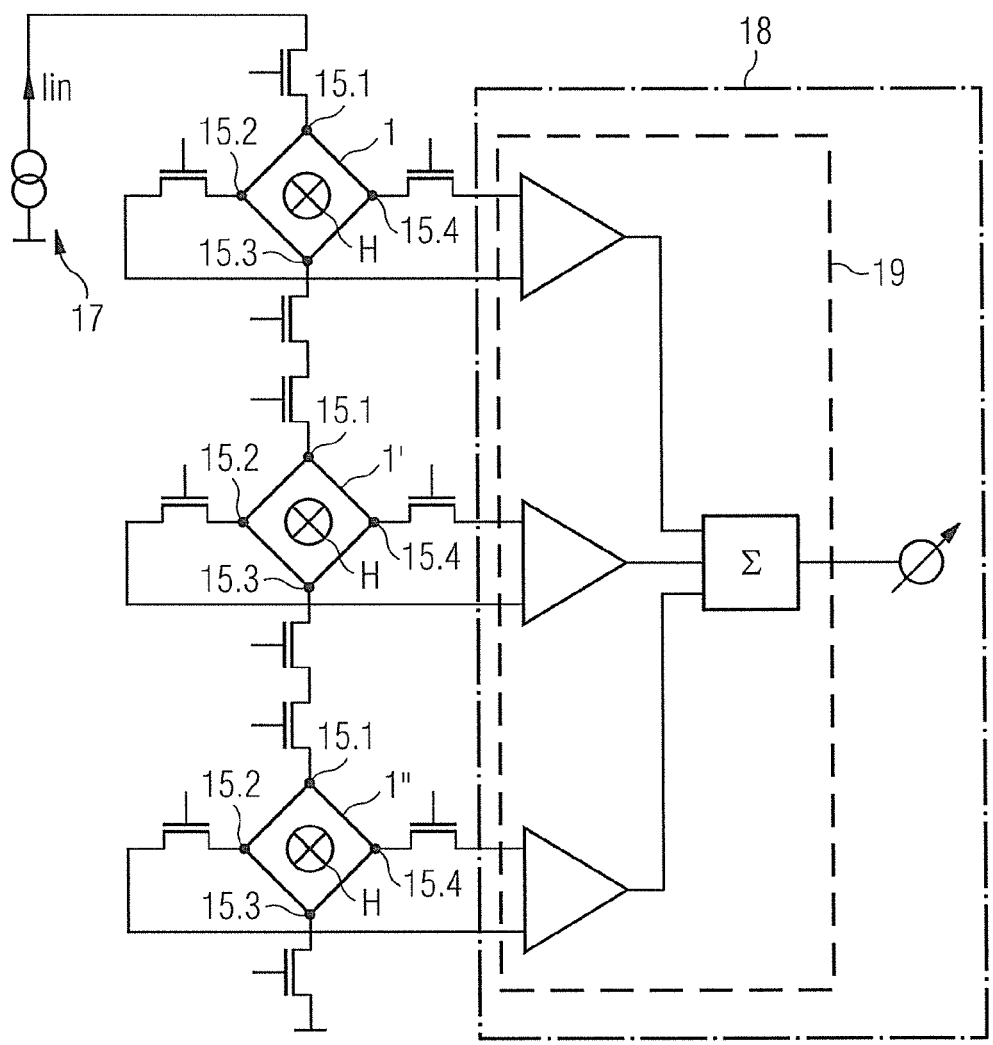
FIG. 22 shows a schematic top view of a system comprising three vertical Hall effect devices connected in series.

FIG. 22 shows a schematic view of a system comprising three vertical Hall effect devices connected in series (or electrically stacked). Thereby each Hall effect device is denoted by a square with terminals in its corners. This symbol is identical to conventional Hall plates that detect a magnetic field perpendicular to the main surface of the substrate. It denotes that the inventive Vertical Hall effect device with four terminals 15.1, 15.2, 15.3, 15.4 behaves similar to a conventional Hall plate: it has four terminals with identical resistance between terminals 1-3 and 2-4 and it is operated such that current flows between 1-3 while signal is tapped between 2-4 (or vice versa current flows between 2-4 and signal is tapped between 1-3). The only difference is that the inventive Vertical Hall effect device responds to a magnetic field component parallel to the main surface of the substrate of the chip while a conventional Hall plate responds to the magnetic field component perpendicular to the main surface of the substrate.

The system comprises at least two vertical Hall effect devices 1, 1', 1" according to the invention, wherein the vertical Hall devices 1, 1', 1" are connected in series so that at least 75% of a supply current flowing through a first vertical Hall device 1 is flowing through a second Hall effect device 1'.

The system may further comprise an energy supply and measuring circuit which comprises an energy supply circuit 17 and a measuring circuit 18. FIG. 22 also shows transistor switches (e.g. MOS transistors) in a rough sketch: not all switches are shown, only the ones which are switched on (i.e. conducting) in a specific operating phase are shown. In another operating phase these switches are off (i.e. not conducting) and other switches are on, which connect different terminals of the Hall effect devices to the energy supply and measuring circuit, to ground, and to the other Hall effect devices.

In a preferred embodiment of the invention each of the at least two vertical Hall effect devices provides at least one Hall signal, wherein the Hall signals of the at least two Hall effect devices are combined by a combining unit 19.

The inventive vertical Hall effect devices 1 can be electrically stacked easily (whereby electrically stacking means that essentially the same current flows through all devices, i.e. they are connected in series) yet simultaneously a spinning scheme can be applied to all devices. A schematic for three stacked devices is shown in FIG. 22, whereby each device 1, 1', 1" is replaced by a symbol that resembles an ordinary Hall plate:

The terminals 15.1, 15.2, 15.3, 15.4 of the first vertical Hall device 1; the terminals 15.1', 15.2', 15.3', 15.4' of the second vertical Hall device 1' and the terminals 15.1", 15.2", 15.3", 15.4" of the third vertical Hall effect device 1" are shown: they are in counter-clock-wise direction. Each terminal is connected to MOS-switches that connect the terminal to the current supply (or to the neighboring devices or ground) and to the amplifiers for the output signals. The common mode potentials of the three signals are different. The signals are added to give an overall signal per clock phase. In the next clock phase the terminals 15.1, 15.2, 15.3, 15.4, 15.1', 15.2', 15.3', 15.4' 15.1", 15.2", 15.3", 15.4" of all devices 1, 1', 1" may be rotated (e.g. clock-wise). All devices 1, 1', 1" are subject to essentially the same magnetic field H.

The above described is merely illustrative, and it is understood that modifications and variations of the arrangements and the details described herein will be apparent to others skilled in the art. It is the intent, therefore, to be limited only by the scope of the impending claims and not by the specific details presented by way of description and explanation above.

The invention claimed is:

1. A vertical Hall effect device comprising:
   at least four Hall effect regions comprising a first Hall effect region, a second Hall effect region, a third Hall effect region and a fourth Hall effect region, which are at least partly decoupled from each other;
   wherein each of the at least four Hall effect regions has a first face and a second face opposite of the first face;
   wherein each of the at least four Hall effect regions has on the first face a first contact as well as a second contact, wherein the first contact and the second contact are placed symmetrically with respect to a plane of symmetry at the respective Hall effect region, wherein the plane of symmetry is orientated perpendicular to a straight line between the first contact and the second contact of the respective Hall effect region;
   wherein each of the at least four Hall effect regions has at least one contact area, which is placed at least in an area around the respective plane of symmetry, wherein low ohmic connection means comprise at least one low ohmic connecting path connecting the contact areas of the at least four Hall effect regions.

2. A vertical Hall effect device according to claim 1, wherein each of the at least four Hall effect regions has one of said contact areas arranged on the first face, wherein the low ohmic connecting path contacting the areas is arranged on the first face.

3. A vertical Hall effect device according to claim 2, wherein the low ohmic connecting path arranged on the first face comprises a low ohmic connection wire structure.

4. A vertical Hall effect device according to claim 1, wherein each of the at least four Hall effect regions has one of said contact areas arranged on the second face and the contact areas arranged on the second face are connected by a low ohmic connecting path comprising a low ohmic layer structure or wherein each of the at least four Hall effect regions has one of said contact areas arranged between the first and the second face and the contact areas arranged between the first face and the second face are connected by a low ohmic connecting path comprising a low ohmic layer structure.

5. A vertical Hall effect device according to claim 4, wherein the low ohmic layer structure comprises a buried layer.

6. A vertical Hall effect device according to claim 1, wherein at least two of the Hall effect regions are arranged in a row, wherein neighboring Hall effect regions of the row are spaced by a respective resistive bridge portion, wherein resistive ending portions having a similar geometry and/or comprising a similar material as the bridge portion are attached to both ends of the row.

7. A vertical Hall effect device according to claim 1, wherein the first Hall effect region, the second Hall effect region, the third Hall effect region and the fourth Hall effect region are arranged on a common substrate.

8. A vertical Hall effect device according to claim 1, wherein at least two of the Hall effect regions are at least partially decoupled along a minimum distance in a top view between the contacts of the two Hall effect regions by a reverse biased pn-junction and/or by a trench-wall coated with an insulating thin film.

9. A vertical Hall effect device according to claim 1, wherein the first Hall effect region and the second Hall effect region are arranged in such a way that their planes of symmetry are parallel or identical, and wherein the third Hall effect region and the fourth Hall effect region are arranged in such a way that their planes of symmetry are parallel or identical.

10. A vertical Hall effect device according to claim 1, wherein the first contacts of the first Hall effect region and the second Hall effect region are facing away from the respective plane of symmetry in a same direction, wherein the second contacts of the first Hall effect region and the second Hall effect region are facing away from the respective plane of symmetry in an opposite direction, wherein the first contacts of the third Hall effect region and the fourth Hall effect region are facing away from the respective plane of symmetry in a same direction, wherein the second contacts of the third Hall effect region and the fourth Hall effect region are facing away from the respective plane of symmetry in an opposite direction.

11. A vertical Hall effect device according to claim 1, wherein the first Hall effect region, the second Hall effect region, the third Hall effect region and the fourth Hall effect region are arranged in such way that their planes of symmetry are parallel or identical.

12. A vertical Hall effect device according to claim 1, wherein the first contacts of the first Hall effect region, the second Hall effect region, the third Hall effect region and the fourth Hall effect region are facing away from the respective plane of symmetry in a same direction, wherein the second contacts of the first Hall effect region, the second Hall effect region, the third Hall effect region and the fourth Hall effect region are facing away from the respective plane of symmetry in an opposite direction.

13. A vertical Hall effect device according to claim 1, wherein at least one of said low ohmic connection paths is electrically connected to a biasing voltage source.

14. A vertical Hall effect device according to claim 1, wherein at least one of said low ohmic connection paths is electrically floating.

15. A vertical Hall effect device according to claim 1, wherein the vertical Hall effect device comprises an energy supply and measuring circuit configured to supply the at least four Hall effect regions with electrical energy and configured to measure at least one electrical Hall effect output signal responsive to a magnetic field.

16. A vertical Hall effect device according to claim 15, wherein the energy supply and measuring circuit is configured to supply the electrical energy to a first specific contact and a second specific contact of the first contacts and/or second contacts wherein the specific contacts are chosen differently in different modes of operation.

17. A vertical Hall effect device according to claim 15, wherein the energy supply and measuring circuit is configured to measure the at least one electrical Hall signal responsive to a magnetic field at a third specific contact of the first contacts and/or second contacts and at a fourth specific contact of the first contacts and/or second contacts, and wherein the specific contacts are chosen differently in different modes of operation.

18. A vertical Hall effect device according to claim 15, wherein each of the first contacts and each of the second contacts of the at least four Hall effect regions are connected individually to the energy supply and measuring circuit.

19. A vertical Hall effect device according to claim 15, wherein the energy supply and measuring circuit is configured
in such a way that in a first mode of operation
a first current is input to the first contact of the first Hall effect region,
a second current is input to the second contact of the second Hall effect region,
a third current is output at the first contact of the third Hall effect region,
a fourth current is output at the second contact of the fourth Hall effect region,
a first Hall voltage is measured from the first contact of the second Hall effect region to the second contact of the first Hall effect region,
a second Hall voltage is measured from the second contact of the third Hall effect region to the first contact of the fourth Hall effect region, and/or
in such a way that in a second mode of operation
a first current is input to the second contact of the first Hall effect region,
a second current is input to the first contact of the second Hall effect region,
a third current is output at the second contact of the third Hall effect region,
a fourth current is output at the first contact of the fourth Hall effect region,
a first Hall voltage is measured from the first contact of the first Hall effect region to the second contact of the second Hall effect region,
a second Hall voltage is measured from the second contact of the fourth Hall effect region to the first contact of the third Hall effect region, and/or
in such a way that in a third mode of operation
a first current is input to the first contact of the third Hall effect region,
a second current is input to the second contact of the fourth Hall effect region,
a third current is output at the first contact of the first Hall effect region,
a fourth current is output at the second contact of the second Hall effect region,
a first Hall voltage is measured from the second contact of the first Hall effect region to the first contact of the second Hall effect region,
a second Hall voltage is measured from the first contact of the fourth Hall effect region to the second contact of the third Hall effect region, and/or
in such way that in a fourth mode of operation
a first current is input to the second contact of the third Hall effect region,
a second current is input to the first contact of the fourth Hall effect region,
a third current is output at the second contact of the first Hall effect region,
a fourth current is output at the first contact of the second Hall effect region,
a first Hall voltage is measured from the second contact of the second Hall effect region to the first contact of the first Hall effect region,
a second Hall voltage is measured from the first contact of the third Hall effect region to the second contact of the fourth Hall effect region.

20. A vertical Hall effect device according to claim 19, wherein the energy supply and measuring circuit is configured to execute a measuring cycle having a first phase in which the device operates in the first mode of operation and having a second phase in which the device operates in the second mode of operations, wherein measurement results of the first phase and measurement results of the second phase are combined, or
wherein the energy supply and measuring circuit is configured to execute a measuring cycle having a first phase in which the device operates in the third mode of operation and having a second phase in which the device operates in the fourth mode of operations, wherein measurement results of the first phase and measurement results of the second phase are combined, or wherein the energy supply and measuring circuit is configured to execute a measuring cycle having a first phase in which the device operates in the first mode of operation, having a second phase in which the device operates in the second mode of operations, having a third phase in which the device operates in the third mode of operation and a fourth phase in which the device operates in the fourth mode of operations, wherein measurement results of the first phase and measurement results of the second phase and measurement results of the third phase and measurement results of the fourth phase are combined.

21. A vertical Hall effect device according to claim 15, wherein the energy supply and measuring circuit is configured in such way that in a first mode of operation
a first supply potential is supplied to the first contact of the first Hall effect region,
a second supply potential is supplied to the second contact of the second Hall effect region,
a third supply potential is supplied to the first contact of the third Hall effect region,
a fourth supply potential is supplied to the second contact of the fourth Hall effect region,
a first output current from the first contact of the second Hall effect region to the second contact of the first Hall effect region is measured,
a second output current from the second contact of the third Hall effect region to the first contact of the fourth Hall effect region is measured, and/or
in such way that in a second mode of operation
a first supply potential is supplied to the second contact of the first Hall effect region,
a second supply potential is supplied to the first contact of the second Hall effect region,
a third supply potential is supplied to the second contact of the third Hall effect region,
a fourth supply potential is supplied to the first contact of the fourth Hall effect region,
a first output current from the first contact of the first Hall effect region to the second contact of the second Hall effect region is measured,
a second output current from the second contact of the fourth Hall effect region to the first contact of the third Hall effect region is measured, and/or
in such way that in a third mode of operation
a first supply potential is supplied to the first contact of the third Hall effect region,
a second supply potential is supplied to the second contact of the fourth Hall effect region
a third supply potential is supplied to the first contact of the first Hall effect region,
a fourth supply potential is supplied to the second contact of the second Hall effect region,
a first output current from the second contact of the first Hall effect region to the first contact of the second Hall effect region is measured,
a second output current from the first contact of the fourth Hall effect region to the second contact of the third Hall effect region is measured, and/or
in such way that in a fourth mode of operation
a first supply potential is supplied to the second contact of the third Hall effect region,
a second supply potential is supplied to the first contact of the fourth Hall effect region,
a third supply potential is supplied to the second contact of the first Hall effect region,
a fourth supply potential is supplied to the first contact of the second Hall effect region,
a first output current is measured from the second contact of the second Hall effect region to the first contact of the first Hall effect region,
a second output current is measured from the first contact of the third Hall effect region to the second contact of the fourth Hall effect region.

22. A vertical Hall effect device according to claim 15, wherein the energy supply and measuring circuit is configured in such a way that in a first mode of operation
the first terminal and the third terminal are used to supply the Hall effect regions with electrical energy, and the second terminal and the fourth terminal are used for tapping an electrical Hall output signal responsive to the magnetic field, and in such a way that in a second mode of operation
the second terminal and the fourth terminal are used to supply the Hall effect regions with electrical energy, and the third terminal and the first terminal are used for tapping an electrical Hall output signal responsive to the magnetic field.

23. A vertical Hall effect device according to claim 22, wherein the energy supply and measuring circuit is configured to execute a measuring cycle having a first phase in which the device operates in the first mode of operation and having a second phase in which the device operates in the second mode of operations, wherein measurement results of the first phase and measurement results of the second phase are combined, or wherein the energy supply and measuring circuit is configured to execute a measuring cycle having a first phase in which the device operates in the third mode of operation and having a second phase in which the device operates in the fourth mode of operations, wherein measurement results of the first phase and measurement results of the second phase are combined, or wherein the energy supply and measuring circuit is configured to execute a measuring cycle having a first phase in which the device operates in the first mode of operation, having a second phase in which the device operates in the second mode of operations, having a third phase in which the device operates in the third mode of operation and a fourth phase in which the device operates in the fourth mode of operations, wherein measurement results of the first phase and measurement results of the second phase and measurement results of the third phase and measurement results of the fourth phase are combined.

24. A vertical Hall effect device according to claim 1, wherein each of the first contacts and each of the second contacts of the at least four Hall effect regions are connectable or connected via a first terminal, a second terminal, a third terminal and a fourth terminal to the energy supply and measuring circuit, wherein the first terminal is connectable or connected to the second contact of the first Hall effect region and to the first contact of the second Hall effect region, wherein the second terminal is connectable or connected to the second contact of the second Hall effect region and to the first contact of the third Hall effect region, wherein the third terminal is connectable or connected to the second contact of the third Hall effect region and to the first contact of the forth Hall effect region, wherein the fourth terminal is connectable or connected to the second contact of the fourth Hall effect region and to the first contact of the first Hall effect region.

25. A vertical Hall effect device according to claim 1, wherein low ohmic is defined as: having an electrical conductivity which is at least 10 times, preferred at least 30 times, more preferred at least 100 times of the conductivity of the Hall effect region.

26. A system comprising at least two vertical Hall effect devices, each of the at least two vertical Hall effect devices comprises:
- at least four Hall effect regions comprising a first Hall effect region, a second Hall effect region, a third Hall effect region and a fourth Hall effect region, which are at least partly decoupled from each other;
- wherein each of the at least four Hall effect regions has a first face and a second face opposite of the first face;
- wherein each of the at least four Hall effect regions has on the first face a first contact as well as a second contact, wherein the first contact and the second contact are placed symmetrically with respect to a plane of symmetry at the respective Hall effect region, wherein the plane of symmetry is orientated perpendicular to a straight line between the first contact and the second contact of the respective Hall effect region; wherein each of the at least four Hall effect regions has at least one contact area, which is placed at least in an area around the respective plane of symmetry, wherein low ohmic connection means comprise at least one low ohmic connecting path connecting the contact areas of the at least four Hall effect regions,
- wherein the vertical Hall effect devices are connected in series so that a supply current flowing through a first vertical Hall device of the at least two Hall effect devices is flowing through a second Hall effect device of the at least two Hall effect devices.

27. A system according to the claim 26, wherein each of the at least two vertical Hall effect devices provides at least one electrical Hall output signal, wherein the electrical Hall output signals of the at least two vertical Hall effect devices are combined by a combining unit.

* * * * *